United States Patent
Tsuchihashi et al.

(10) Patent No.: US 6,416,618 B2
(45) Date of Patent: *Jul. 9, 2002

(54) WAFER PROCESSING APPARATUS

(75) Inventors: Masaaki Tsuchihashi; Minoru Hanazaki; Hideki Oura, all of Tokyo (JP)

(73) Assignees: Mitsubishi Denki Kabushiki Kaisha; Mitsubishi Denki Engineering Co., Ltd., both of Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/354,574

(22) Filed: Jul. 16, 1999

(30) Foreign Application Priority Data

Mar. 10, 1999 (JP) ............................................. 11-062638

(51) Int. Cl.⁷ .................................................. C23F 1/02

(52) U.S. Cl. ............................. 156/345.51; 156/345.52; 156/345.24; 118/723 E; 118/725; 118/728

(58) Field of Search .................................. 118/729, 725, 118/728, 723 R, 723 E; 156/345; 361/234; 279/128

(56) References Cited

U.S. PATENT DOCUMENTS

5,117,121 A * 5/1992 Watanabe et al. ........... 307/130
5,982,986 A * 11/1999 Davenport .................. 392/418
6,033,482 A * 3/2000 Parkhe ....................... 118/728

FOREIGN PATENT DOCUMENTS

| JP | 4-298062 | 10/1992 |
| JP | 6-163674 | 6/1994 |
| JP | 7-50736 | 5/1995 |

* cited by examiner

Primary Examiner—Gregory Mills
Assistant Examiner—Luz Alejandro
(74) Attorney, Agent, or Firm—McDermott, Will & Emery

(57) ABSTRACT

There is described a wafer processing apparatus intended to efficiently secure a wafer on an electrostatic chuck. A heater is disposed in a processing chamber for heating a wafer, and a dielectric plate for supporting the wafer is also disposed in the processing chamber. First and second electrodes are embedded in the dielectric plate, and first and second variable D.C. power supplies are disposed so as to supply voltages to the first and second electrodes, respectively. After the wafer has been placed on an electrostatic chuck, the wafer is pre-heated before being subjected to attraction force. After completion of the pre-heating phase, the first and second D.C. power supplies supply voltages to the first and second electrodes, thus securing the wafer on the dielectric plate.

18 Claims, 21 Drawing Sheets

| WAFER PRE-HEATING | WAFER ||
| --- | --- | --- |
|  | SILICON WAFER | SILICON WAFER WITH OXIDE FILM |
| 3 min. | FRACTURES | FRACTURES |
| 1 0 min. | NO FRACTURE | FRACTURES |
| 2 0 min. | NO FRACTURE | NO FRACTURE |
| 6 0 min. | NO FRACTURE | NO FRACTURE |

USABLE RANGE

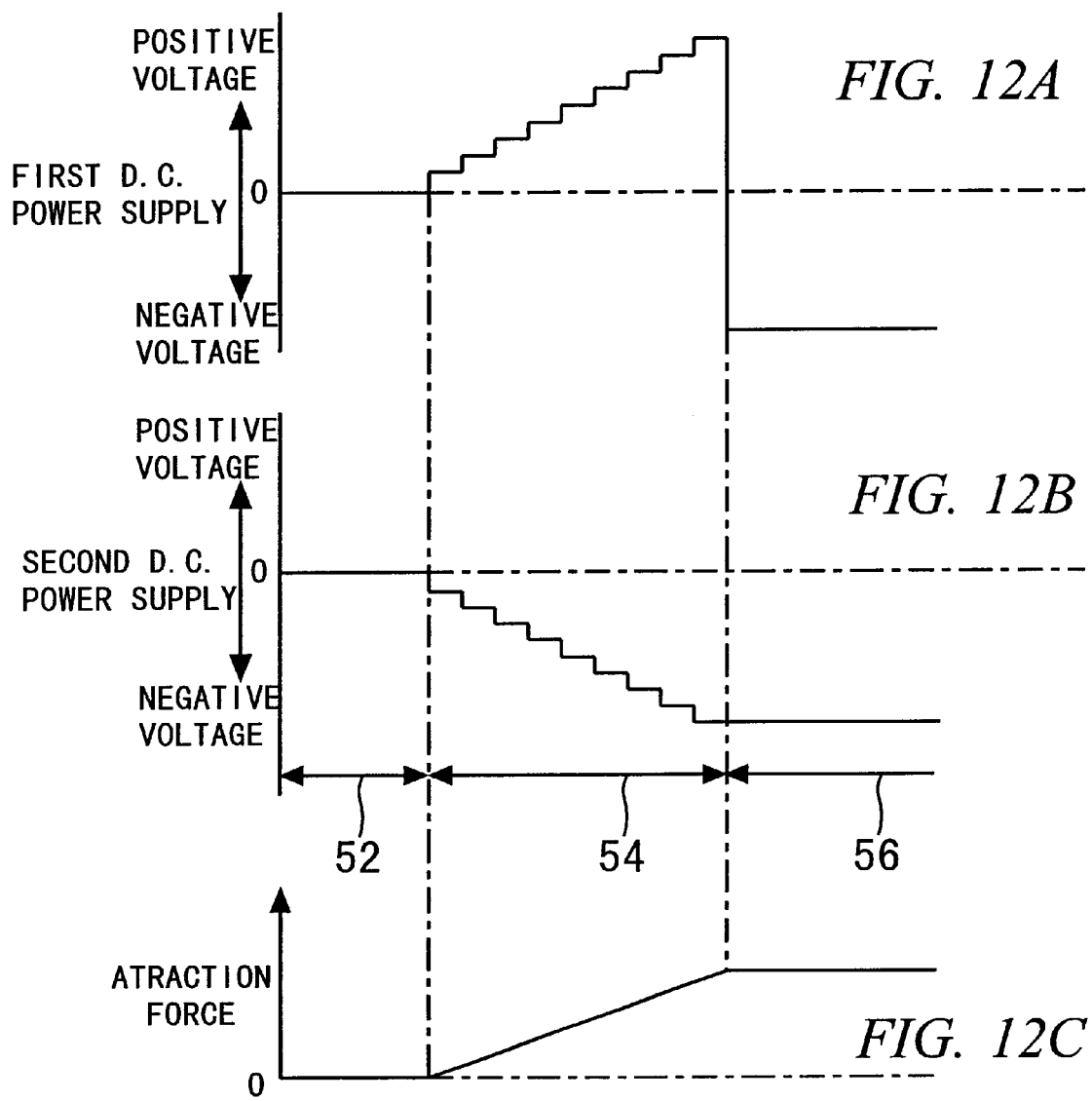

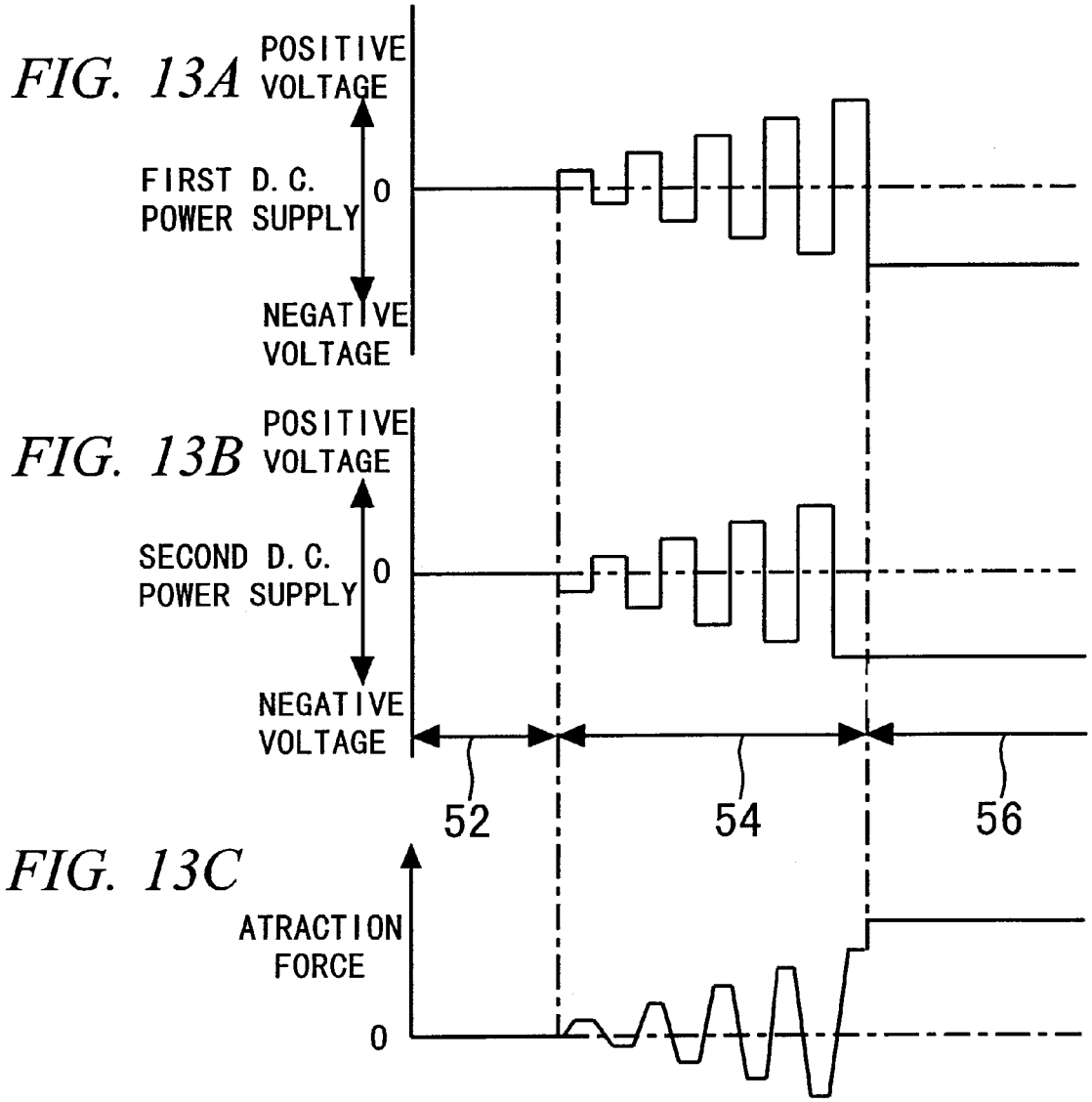

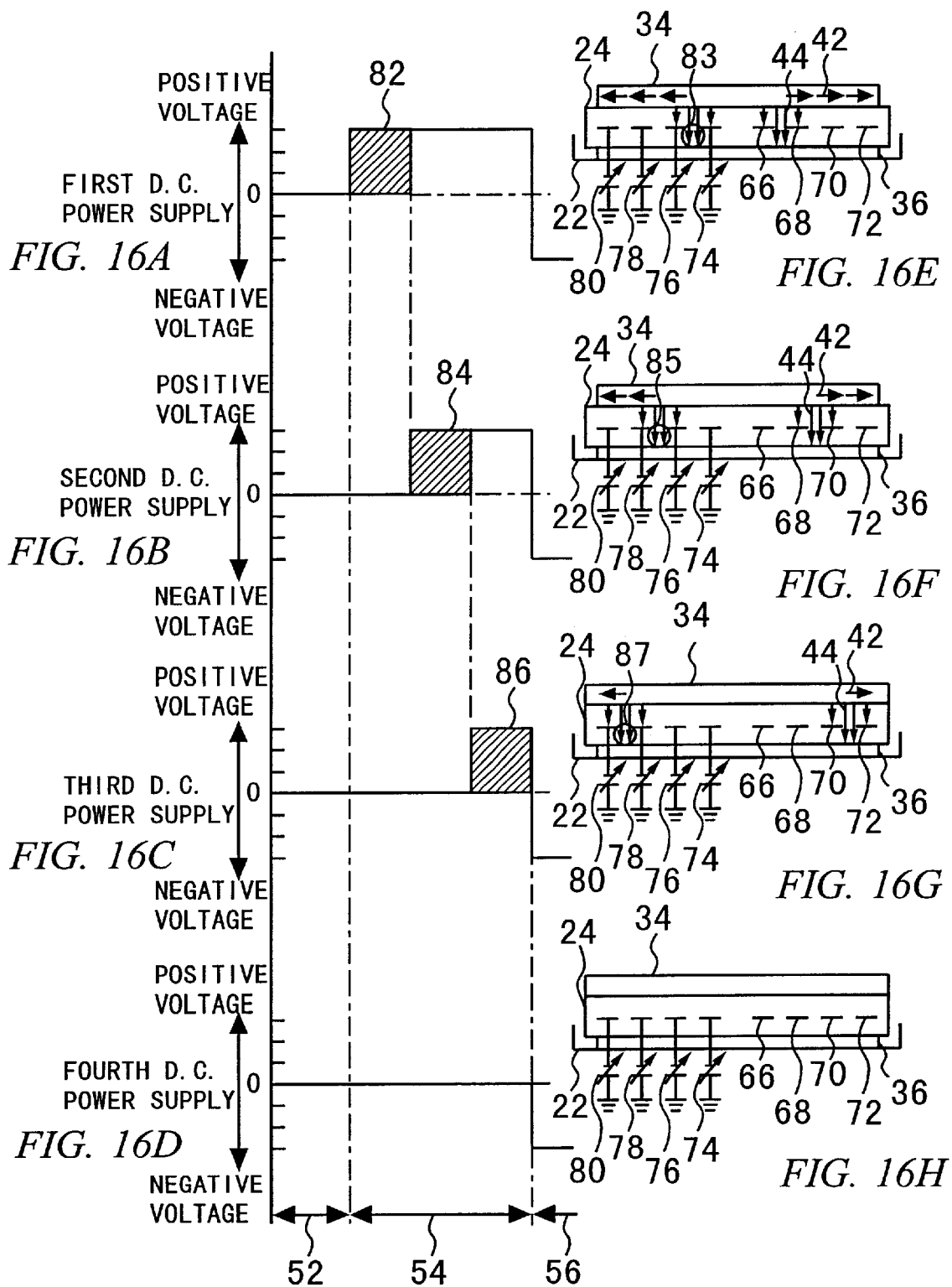

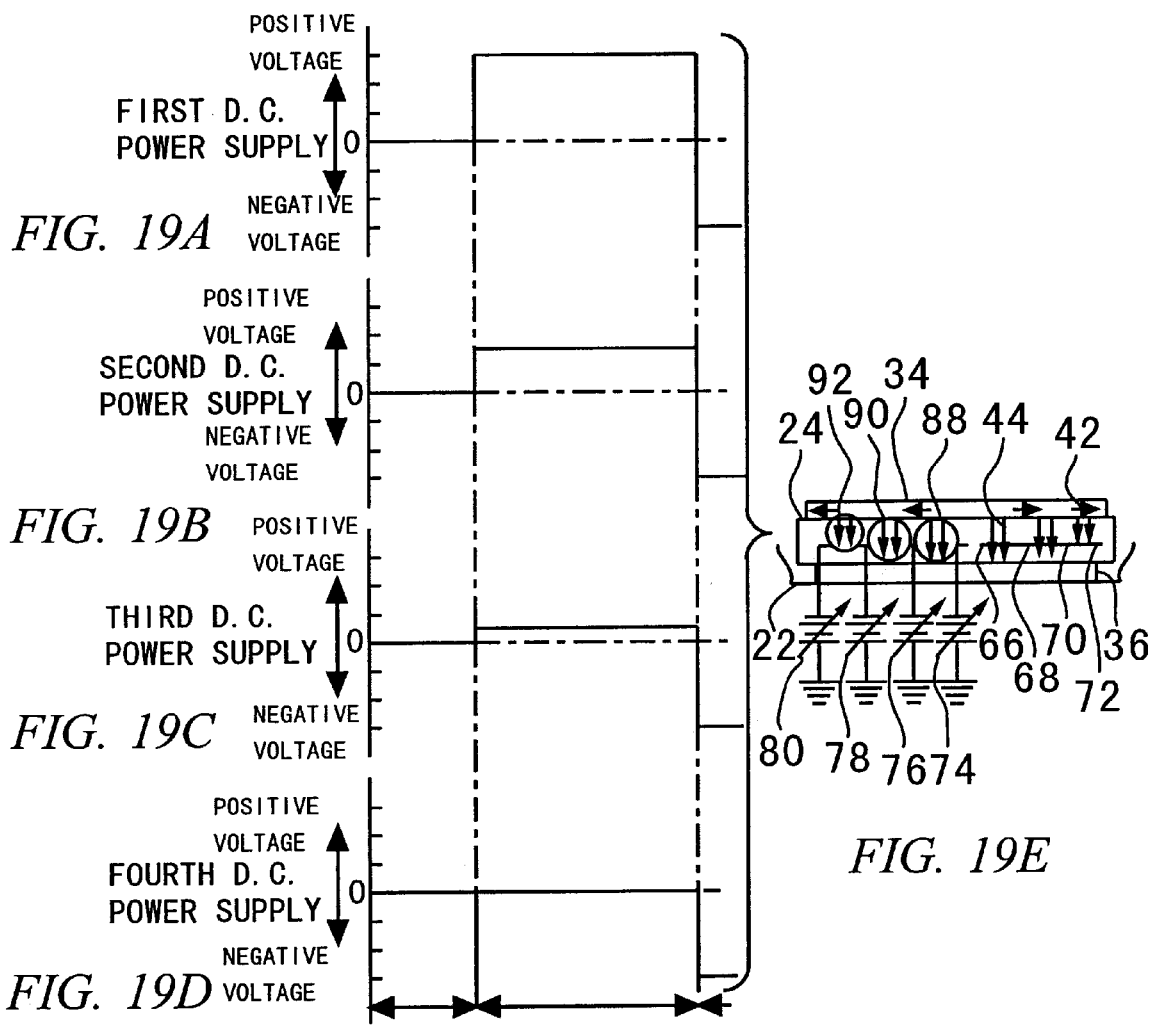

WAFER PROCESSING APPARATUS

BACKGROUND OF THE INVENTION

1. Field of the Invention

The present invention generally relates to a wafer processing apparatus, and more particularly, to a wafer processing apparatus which holds a wafer on an electrostatic chuck such that the wafer is subjected to desired processing steps such as etching, ashing, film growth, sputtering, or doping.

2. Description of the Background Art

Electrostatic chuck techniques have recently come to be applied to many types of apparatus for subjecting a wafer to various processing steps; for example, a plasma etching apparatus and a film growth apparatus. With a wafer clamp which has conventionally been used (i.e., a clamp for holding the periphery of a wafer), impurities are likely to deposit on the periphery of the wafer, as well as the periphery of the wafer is unavailable for production. The electrostatic chuck is used for reasons of preventing deposition of impurities on the periphery of the wafer, rendering the outermost periphery of the wafer available for production, and resulting in improved product yield.

Further, use of the electrostatic chuck yields temperature uniformity which is more stable than that yielded by use of the wafer clamp. For this reason, the electrostatic chuck can ensure superior processing performance even when the diameter of the wafer is increased. Consequently, as the diameter of a wafer becomes larger, the electrostatic chuck technique will be more commonly employed for semiconductor manufacturing systems.

This electrostatic chuck involves many technical problems for practical use. For instance, high-temperature processing (at a temperature of more than 200° C.) of a wafer has recently been carried out frequently. When a wafer is chucked by a heated electrostatic chuck during the high-temperature processing, the wafer may be warped and damaged by thermal stress. For this reason, to ensure stable operation of the electrostatic chuck, there has been employed a manner in which a wafer heating means is specially provided, and a pre-heated wafer is conveyed to a electrostatic chuck so as to be subjected to desired wafer processing.

FIG. 1 is a schematic diagram showing the configuration of an electrostatic chucking apparatus described in Japanese Patent Application Laid-open No. Hei4-288062. The chucking apparatus shown in FIG. 1 comprises a main chamber 10 and a sub-chamber 12. An electrostatic chuck 14 having a heater is disposed within the main chamber 10, and a resistance heating medium 16 is provided within the electrostatic chuck 14. A wafer 18 is processed on the electrostatic chuck 14 while being heated by the resistance heating medium 16.

A wafer support tool 20 is disposed within the sub-chamber 12. The resistance heating medium 16 is provided within the wafer support tool 20, as in the electrostatic chuck 14. The wafer 18 is pre-heated within the sub-chamber 12 by the resistance heating medium 16 before being subjected to high temperature within the main chamber 10.

Next, there will be given an explanation of how the wafer is damaged while being directly secured by a high-temperature electrostatic chuck.

FIGS. 2A and 2B show a wafer processing apparatus having a commonly-employed electrostatic chuck. More particularly, FIG. 2A is a cross-sectional view of a conventional wafer processing apparatus taken along a plane A—A shown in FIG. 2B, and FIG. 2B is a front view of the conventional wafer processing apparatus. The electrostatic chuck shown in FIGS. 2A and 2B is of a well known two-electrode type.

In FIGS. 2A and 2B, reference numeral 22 designates a processing chamber for shielding the interior thereof from outside air; 24 designates a dielectric plate which is provided within the processing chamber 22 for generating electrostatic force; 26 designates a first electrode placed in the dielectric plate 24; 28 designates a second electrode disposed concentrically with the first electrode 26 in the dielectric plate 24; 30 designates a first variable D.C. power supply provided in order to apply a predetermined D.C. voltage to the first electrode 26; 32 designates a second variable D.C. power supply provided in order to apply a predetermined D.C. voltage to the second electrode 28; 34 designates a wafer which is held on the surface of the dielectric plate 24 so as to be subjected to predetermined processing; 36 designates a heater provided for heating the wafer 34 to a predetermined temperature by way of the dielectric plate 24; and 38 designates a pusher which passes and receives the wafer to and from a transport robot (not shown) which is provided so as to convey the wafer 34 to the interior of the processing chamber 22 and place the wafer 34 on the surface of the dielectric plate 24. The elements located within the region designated by reference numeral 40 correspond to the structure of a conventional common electrostatic chuck of two-electrode type.

FIG. 3 is a flowchart for explaining holding operation of the electrostatic chuck provided in the conventional wafer processing apparatus.

As shown in FIG. 3, in step S1, the wafer 34 is transported to the interior of the processing chamber 22 from an unillustrated transport robot.

In step S2, the pusher 38 is raised to receive the wafer 34 from the transport robot. The wafer 34 that is transported into the processing chamber 22 is passed from the transport robot to the pusher 38 that has been raised to a predetermined elevated position.

In step S3, the transport robot retracts from the processing chamber 22. After retraction of the robot, the operation proceeds to step S4.

In step S4, the pusher 38 is lowered to place the wafer 34 on the dielectric plate 24.

In step S5, desired voltages (a pair of reverse voltages employed in ordinary cases) are supplied from the first and second variable D.C. power supplies 30 and 32 to the first and second electrodes 26 and 28 embedded in the dielectric plate 24. As a result, the wafer 34 is securely held on the dielectric plate 24 by an electrostatic force.

By reference to FIGS. 4A to 4C, there will be described development of a fracture in the wafer 34 resulting from the holding action of the electrostatic chuck. In FIGS. 4A to 4C, those elements which are the same as those shown in FIGS. 2A and 2B are assigned the same reference numerals, and repetition of their explanations is omitted here.

FIG. 4A shows the wafer 34 immediately after having been placed on the dielectric plate 24; FIG. 4B shows the state of the wafer 34 when it is heated; and FIG. 4C shows a fracture in the wafer 34 resulting from heating. In FIGS. 4A to 4C, arrows depicted by reference numeral 42 indicate the direction in which the wafer 34 expands upon being heated, arrows depicted by reference numeral 44 indicate the direction of the electrostatic attraction force between the wafer 34 and the dielectric plate 24, and the lengths of the arrows 44 indicate the magnitude of the electrostatic attraction force. Reference numeral 46 designates a warp arising in the wafer 34 during the course of a heating process, and reference numeral 48 designates a fracture in the wafer 34 resulting when the warp 46 becomes excessive.

The mechanism whereby the fracture 48 developing in the wafer 34 will now be described in detail. As shown in FIG. 4A, the wafer 34 placed on the dielectric plate 24 is secured on the same by application of a predetermined voltage to the first and second electrodes 26 and 28.

The wafer placed on the dielectric plate 24 extends in the radial direction, i.e., in the direction designated by arrows 42 shown in FIG. 4B due to thermal stress, as being heated by the heater 36.

However, the wafer 34 is fixedly held on the dielectric plate 24 by the electrostatic attraction force. Thus, expansion of the wafer 34 is hindered, thereby generating the warp 46 within the wafer 34. Particularly, in the case of the electrostatic chuck of two-electrode type, strong attraction force acts between the first electrode 26 and the second electrode 28, as indicated by arrows 44. In this case, warping stress greater than the attraction force acts around the center of the wafer 34, thereby causing noticeable deformation to arise in the center of the wafer 34.

When the energy stemming from the warp developed in the wafer 34 due to the thermal stress exceeds the amount of energy sufficient to break the wafer 34, the fracture 48 is developed in the wafer 34 as shown in FIG. 4C. In a case where the wafer 34 maintained at a normal temperature (about 40° C.) is chucked on the dielectric plate 24 adjusted to a temperature of about 250° C. by the heater 36, the fracture 48 through such a mechanism arises in about three seconds after the wafer 34 has been held on the dielectric plate 24. Such a fracture 48 arises in substantially the same manner in a case where a silicon wafer is used as the wafer 34 and in a case where a silicon wafer having an oxide film is used as the wafer 34.

As described above, under the conventional method in which a wafer is directory held on a high-temperature electrostatic chuck, warp arises within the wafer, and in the worst case the wafer is fractured. Thus, in addition to the main chamber, an apparatus for holding the wafer through use of the electrostatic chuck usually comprises a sub-chamber for pre-heating the wafer for the purpose of preventing development of such a fracture in the wafer.

However, such an apparatus comprises a plurality of chambers and hence becomes complicated in structure. Further, since the wafer that has been pre-heated in the sub-chamber must be conveyed to the main chamber, the temperature of the wafer drops during the course of transportation. Also, transportation of the wafer consumes time, thus deteriorating processing capability.

SUMMARY OF THE INVENTION

The present invention has been conceived to solve the previously-mentioned problems, and a general object of the present invention is to provide a novel and useful wafer processing apparatus.

A more specific object of the present invention is to provide a wafer processing apparatus capable of efficiently processing a wafer through use of an electrostatic chuck.

The above objects of the present invention are achieved by a wafer processing apparatus described as follows. The apparatus includes a mechanism for heating a wafer within a processing chamber. Also within the processor chamber is a dielectric plate on which the wafer is placed. At least two electrodes are embedded in the dielectric plate. Variable D.C. power supplies are provided and controlled by a computation instruction device, such as a controller, for supplying voltages to the respective electrodes. The apparatus further includes pre-heating means for pre-heating the wafer placed on the dielectric plate before the wafer is secured on and attracted to the same by application of the voltages.

Other objects and further features of the present invention will be apparent from the following detailed description when read in conjunction with the accompanying drawings.

BRIEF DESCRIPTION OF THE DRAWINGS

FIGS. 12A through 12C are timing charts for describing the operation of the wafer processing apparatus according to the fourth embodiment of the present invention;

FIGS. 13A through 13C are timing charts for describing an operation of a wafer processing apparatus according to a fifth embodiment of the present invention;

FIGS. 16A through 16D are timing charts for describing an operation of the wafer processing apparatus according to the sixth embodiment of the present invention;

FIGS. 16E through 16H are cross-sectional views for describing the operation of the wafer processing apparatus according to the sixth embodiment of the present invention;

FIGS. 19A through 19D are timing charts for describing an operation of the wafer processing apparatus shown in FIG. 18;

FIGS. 19E is a cross-sectional view for describing the operation of the wafer processing apparatus shown in FIG. 18;

DESCRIPTION OF THE PREFERRED EMBODIMENTS

In the following, principles and embodiments of the present invention will be described with reference to the accompanying drawings.

First Embodiment

Figure 2A:
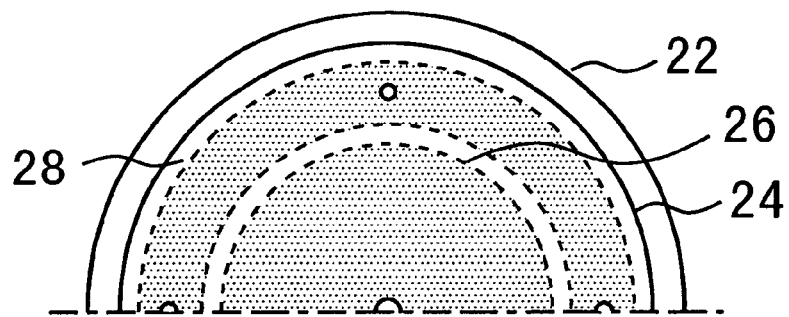
FIG. 2A is a cross-sectional view taken along a plane A—A shown in FIG. 2B and showing a main part of the conventional wafer processing apparatus or a wafer processing apparatus according to a first embodiment of the present invention.
Figure 2B:
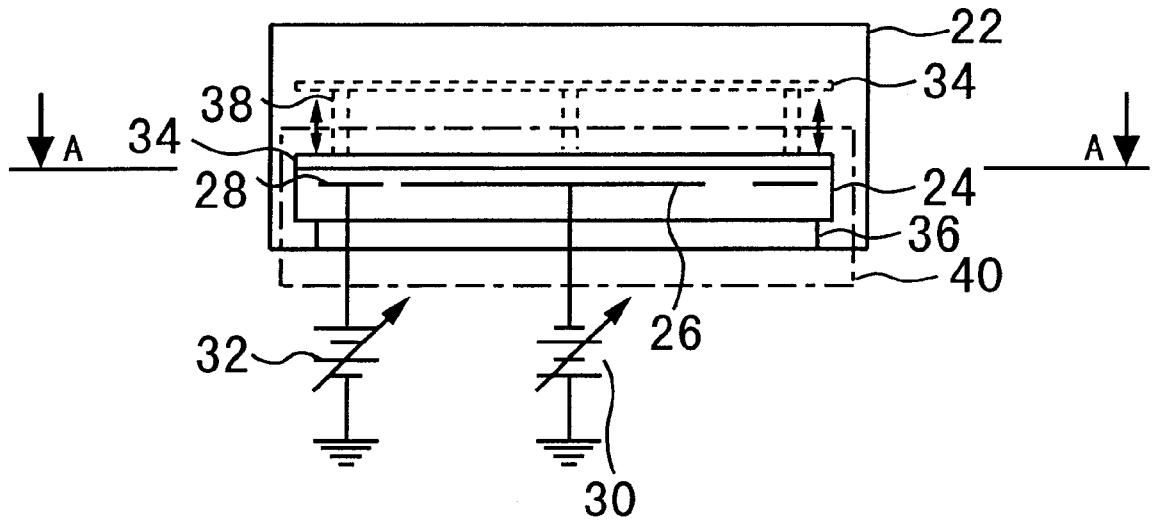
FIG. 2B is a front view of the conventional wafer processing apparatus or the wafer processing apparatus according to the first embodiment of the present invention.

A wafer processing apparatus according to the first embodiment is identical in structure to that of the apparatus shown in FIGS. 2A and 2B. Specifically, the wafer processing apparatus according to the first embodiment is an electrostatic chucking apparatus of two-electrode type which comprises a processing chamber 22. This processing chamber 22 can shield the interior space thereof from outside air.

A dielectric plate 24 is provided within the processing chamber 22 for generating electrostatic force. A first electrode 26 and a second electrode 28 are concentrically provided within the dielectric plate 24. The first electrode 26 is connected to a first variable D.C. power supply 30, and the second electrode 28 is connected to a second variable D.C. power supply 32. The first and second variable D.C. power supplies 30 and 32 are controlled by a computation instruction device, such as a controller, to supply the first and second electrode 28 with predetermined voltages of opposite polarities. The computation instruction device may have signal inputs representing wafer temperature or measurements of a gap between the wafer 34 and the dielectric plate 24.

A wafer 34 to be processed is placed on the surface of the dielectric plate 24. Within the dielectric plate 24 is provided a heater 36 for heating the wafer 34 to a predetermined temperature. Further, the dielectric plate 24 comprises a built-in pusher 38. The pusher 38 is used in order to enable passing of the wafer 34 between the wafer processing apparatus and a transport robot (not shown). In the first embodiment, the portion indicated by reference numeral 40 shown in FIGS. 2A and 2B embodies an electrostatic chuck.

Figure 3:
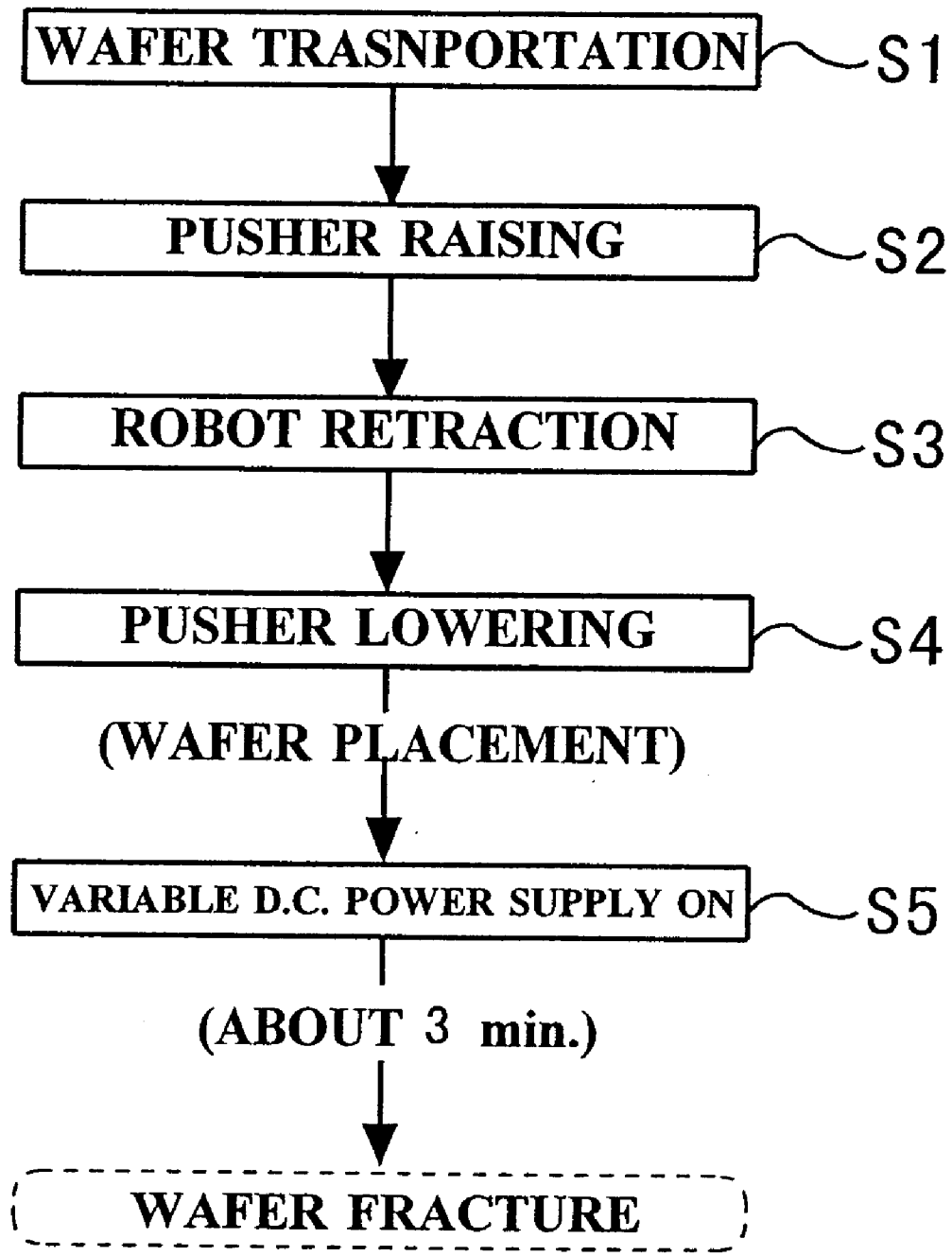
FIG. 3 is a flowchart for describing an operation of the conventional wafer processing apparatus.
Figure 4A:
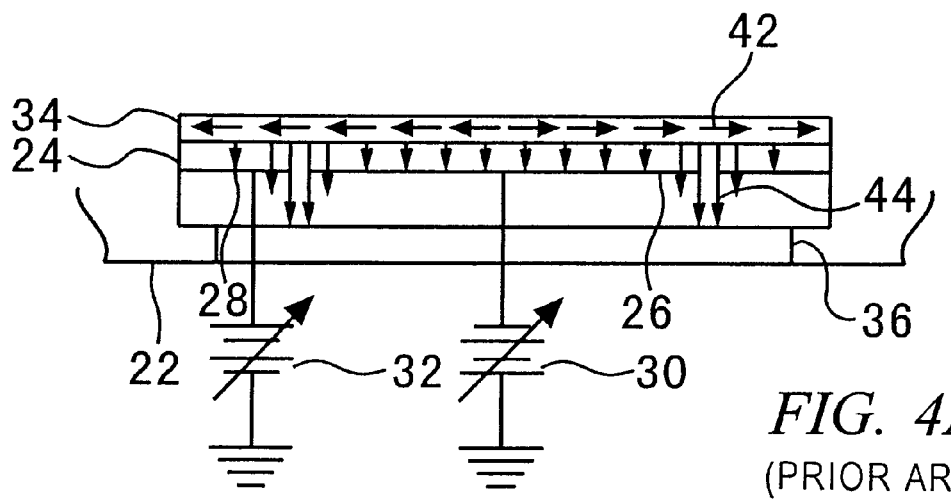
FIGS. 4A through 4C are cross-sectional views for describing the operation of the conventional wafer processing apparatus.
Figure 4B:
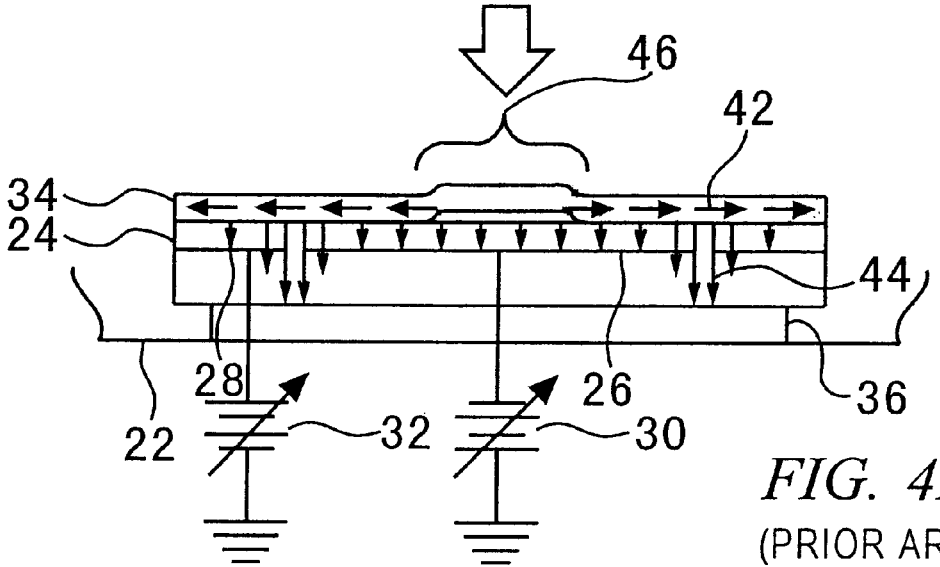
Figure 4C:
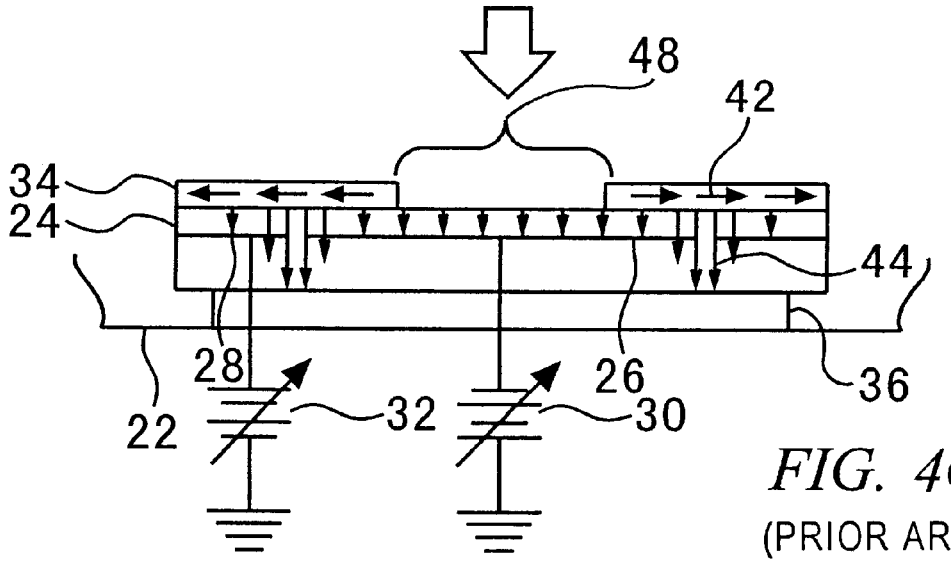
Figure 5:
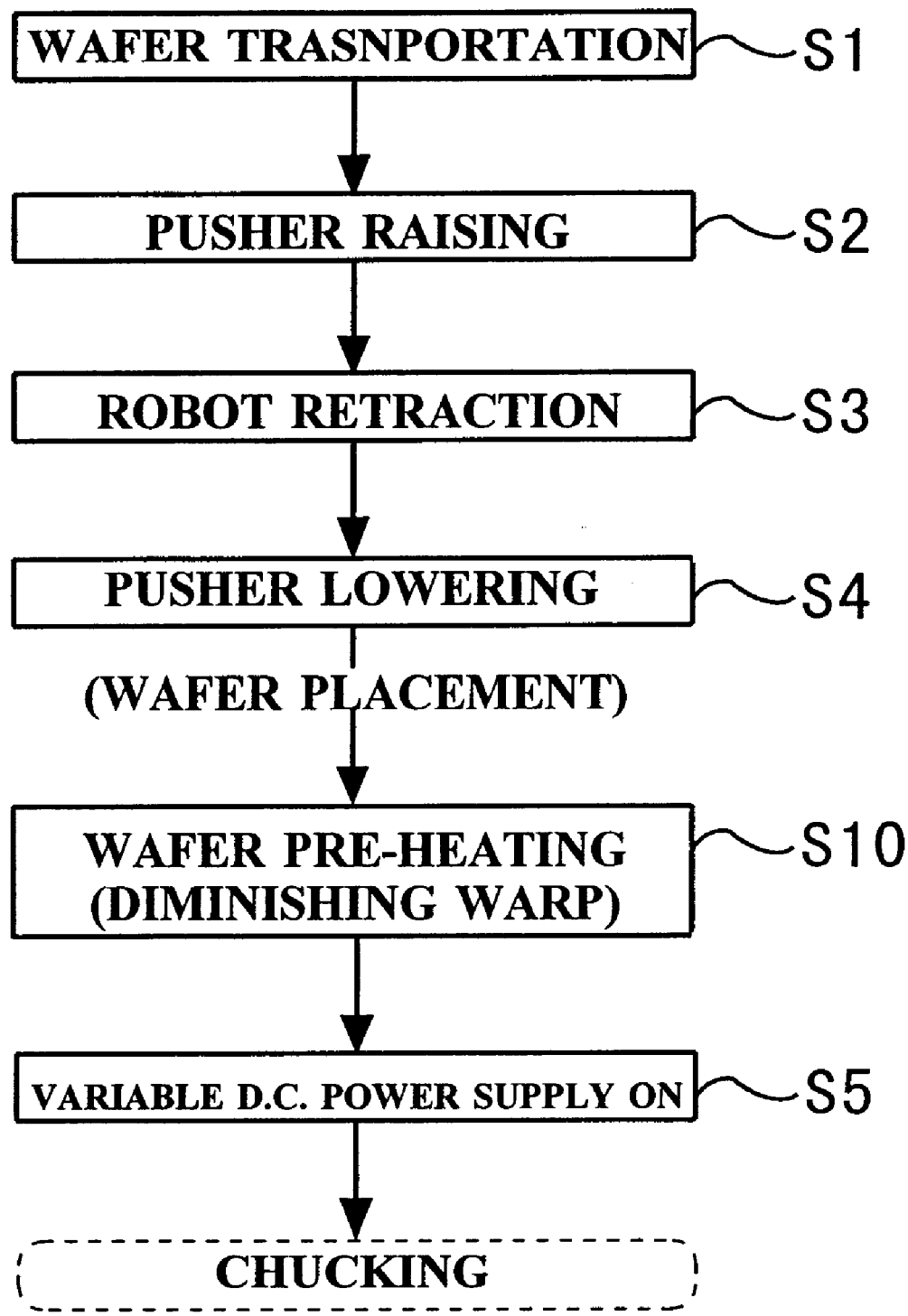
FIG. 5 is a flowchart for describing an operation of the wafer processing apparatus according to the first embodiment of the present invention.

FIG. 5 is a flowchart for describing the holding action of the electrostatic chuck 40 of the first embodiment. In FIG. 5, those steps carrying out the same processing as those of the steps shown in FIG. 3 are assigned the same reference numerals.

As shown in FIG. 5, in step S1, the wafer 34 is transported to the interior of the processing chamber 22 from the unillustrated transport robot.

In step S2, the pusher 38 is raised in order to receive the wafer 34 from the transport robot. The wafer 34 that has been transported into the processing chamber 22 is passed to the pusher 38 after the pusher 38 has been raised to a predetermined elevated position.

In step S3, the transport robot retracts from the processing chamber 22. After the retraction of the robot, the operation proceeds to step S4.

In step S4, the pusher 38 is lowered to place the wafer 34 on the dielectric plate 24. After completion of placing of the wafer on the dielectric plate 24, processing relating to step S10 is performed.

In step S10, the wafer 34 is heated. More specifically, the wafer 34 is heated while the first and second variable D.C. power supplies 30 and 32 for supplying the first and second electrodes 26 and 28 with power are turned off by the computation instruction device. This heating process enables heating of the wafer 34 without inducing a warp therein. When the wafer 34 is heated to a predetermined temperature, processing relating to step S5 is performed.

In step S5, desired voltages (i.e., a pair of reverse voltages in ordinary cases) are controlled by the computation instruction device and supplied from the first and second variable D.C. power supply 30 and 32 to the first and second electrode 26 and 28 embedded in the dielectric plate 24, respectively. As a result, the wafer 34 is held on the dielectric plate 24 by electrostatic force.

Figure 6A:
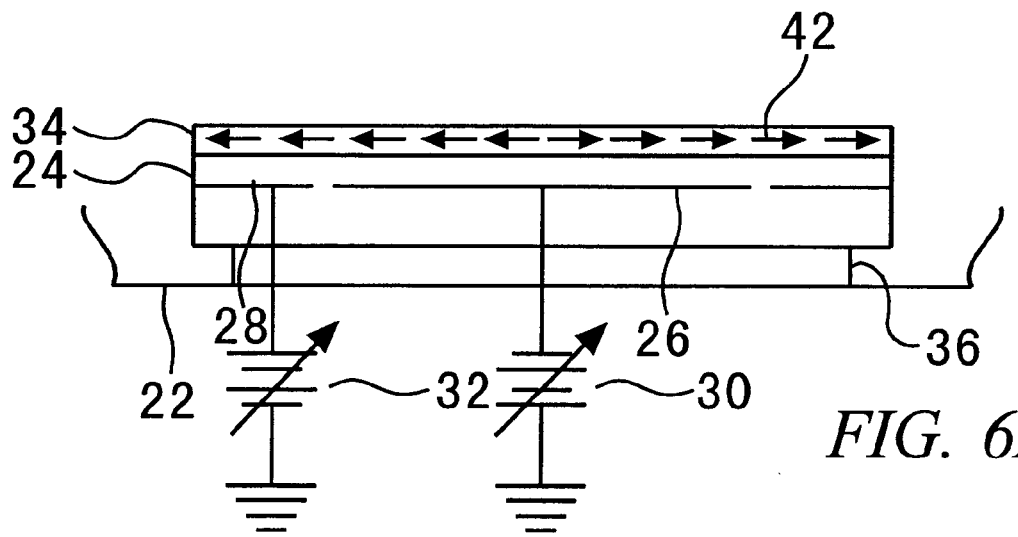
FIGS. 6A through 6C are cross-sectional views for describing the operation of the wafer processing apparatus according to the first embodiment of the present invention.
Figure 6B:
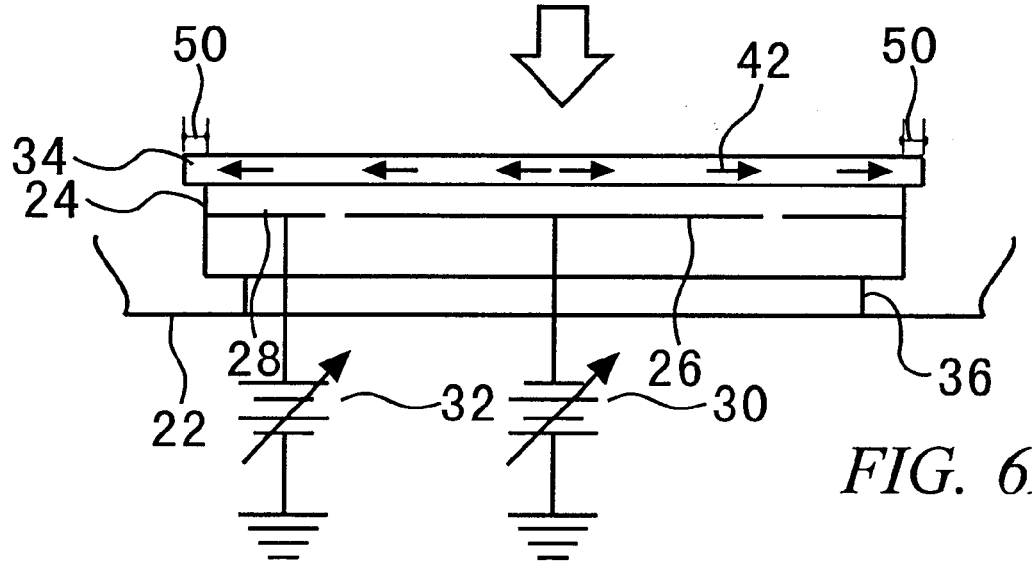
Figure 6C:
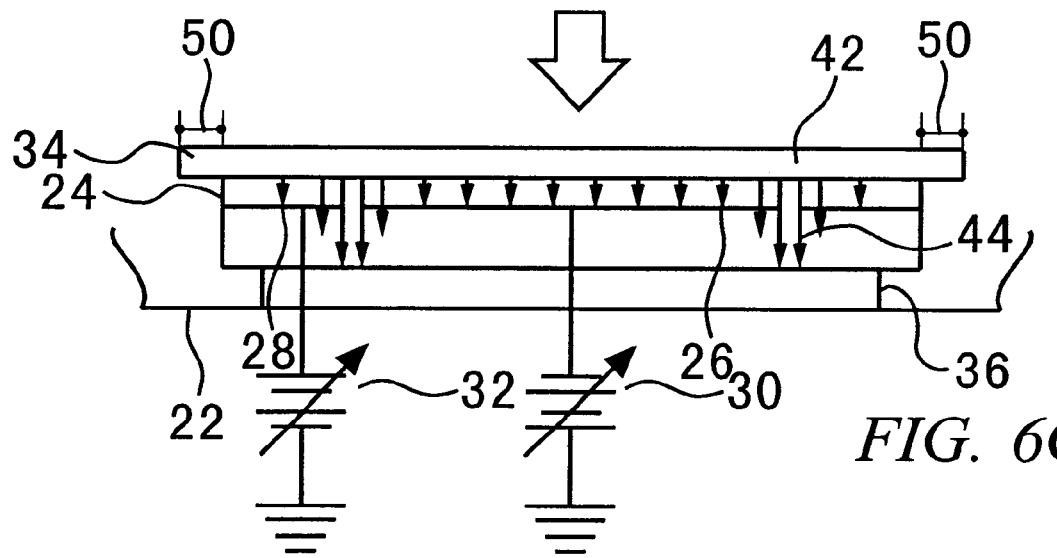

FIGS. 6A to 6C are sectional views for describing variations in the state of the wafer 34 associated with the processing operations relating to steps S5 and S10. In FIG. 6, those elements which are the same as those shown in FIG. 2 are assigned the same reference numerals, and repetition of their explanations is omitted.

FIG. 6A shows the state of the wafer 34 immediately after having been placed on the dielectric plate 24; FIG. 6B shows the state of the wafer 34 when the wafer 34 is heated; and FIG. 6C shows the state of the wafer 34 when it is held on the dielectric plate 24 by electrostatic force after having been heated to a predetermined temperature. In FIGS. 6A to 6C, arrows depicted by reference numeral 42 indicate the direction in which the wafer 34 expands upon being heated, arrows depicted by reference numeral 44 indicate the direction of electrostatic attraction force between the wafer 34 and the dielectric plate 24, and the lengths of the arrows 44 indicate the magnitude of the electrostatic attraction force. Reference numeral 50 designates the expansion of the wafer 34 upon being heated.

Figure 7A:
FIGS. 7A through 7C are timing charts for describing the operation of the wafer processing apparatus according to the first embodiment of the present invention.
Figure 7B:
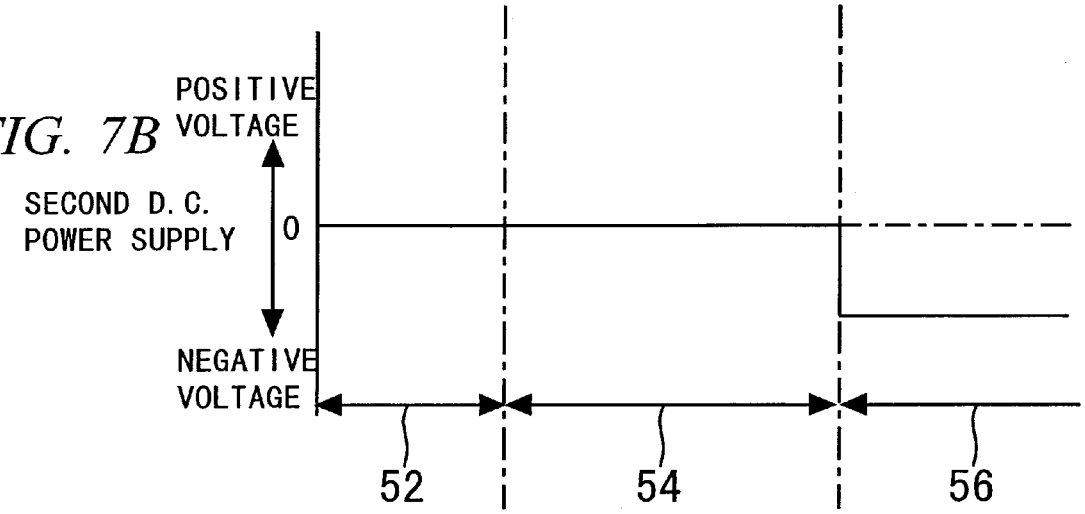
Figure 7C:
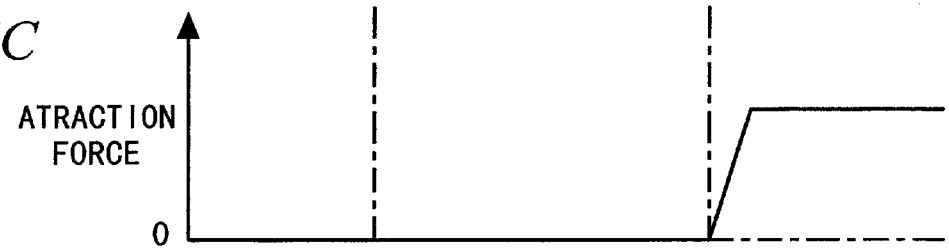

FIGS. 7A to 7C are timing charts for describing an operation for application of voltages to the electrostatic chuck 40 of the first embodiment. In FIGS. 7A to 7C, a period 52 corresponds to a time interval during which the wafer 34 is placed on the dielectric plate 24; a period 54 corresponds to a pre-heating operation phase for pre-heating the wafer 34; and a period 56 corresponds to a wafer processing phase during which the wafer 34 is subjected to processing steps such as etching and film-growth processing.

The operation of the wafer processing apparatus according to the first embodiment will be described by reference to FIGS. 2, 5, 6, and 7.

When the wafer processing apparatus commences processing, as shown in FIG. 6A, the wafer 34 is placed on the dielectric plate 24 (during the period 52 shown in FIGS. 7A to 7C). At this time, the dielectric plate 24 has been heated to and held at a predetermined temperature (200° C. or more) by the heater 36. Immediately after having been placed on the dielectric plate 24, the wafer 34 is heated to the foregoing desired temperature, so that thermal stress induces a distortion in the wafer 34. As a result, the wafer 34 expands in the radial direction, as indicated by arrow 20.

In the state shown in FIG. 6B, the wafer 34 is pre-heated. During the pre-heating phase 54 (see FIGS. 7A to 7C), the voltages applied to the first and second electrodes 26 and 28 from the first and second variable D.C. power supplies 30 and 32 are controlled by a controller 98 so that the voltages are maintained at zero. Accordingly, during the pre-heating phase 54, electrostatic attraction force does not develop in the area between the wafer 34 and the dielectric plate 24. In this case, the wafer 34 expands in the radial direction without being limited by electrostatic attraction force, thereby resulting in occurrence of the expansion 50. As described above, the first embodiment allows the previously-described thermal deformation in the wafer 34 to develop while sufficiently reducing the stress acting on the wafer 34.

When the wafer 34 has been sufficiently heated and the warp in the wafer 34 has been sufficiently reduced, the wafer processing phase 56 (see FIGS. 7A to 7C) is commenced, the controller 98 controls the first and second variable D.C. power supplies so that predetermined voltages are applied to the first and second electrodes 26 and 28 from the first and second variable D.C. power supplies 30 and 32, respectively. As a result, the wafer 34 is held on the dielectric plate 24 as shown in FIG. 6C. Then, processing steps to the wafer 34 fixed on the surface of the dielectric plate 24 such as etching and film-growth processing are carried out.

Figure 8:
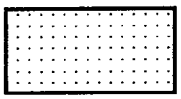
FIG. 8 is a table diagram for describing advantageous results yielded by the wafer processing apparatus according to the first embodiment of the present invention.

FIG. 8 is a table showing the relationship between the duration of the pre-heating phase 54 and the state of the wafer 34. More specifically, the table shows the relationship between the state of the wafer 34 and the time passed since the wafer 34 has been placed on the dielectric plate 24 until the predetermined voltages are applied to the first and second electrodes 26 and 28 from the first and second variable D.C. supplies 30 and 32. The results provided in FIG. 8 are obtained by the wafer processing apparatus according to the first embodiment when the temperature of the heater 36 is set to 250° C.

As shown in FIG. 8, in the wafer processing apparatus according to the first embodiment, in a case where 20 seconds or more are ensured for the phase during which the wafer 34 is pre-heated, no crack; i.e., no fracture develops in either a dummy wafer or a wafer having an oxide film. In a case where the wafer 34 is pre-heated for a period of 20 seconds or greater, no bulge is observed, which would otherwise appear in the center of the wafer 34 when the wafer 34 is not pre-heated. From the results provided in the table, it is understood that pre-heating of the wafer 34 prior to the wafer 34 being placed on the dielectric plate 24 is effective for preventing a fracture from developing in the wafer.

As mentioned above, the wafer processing apparatus according to the first embodiment enables holding of the wafer 34 on the dielectric plate 24 without causing a fracture. Further, since the wafer processing apparatus enables pre-heating of the wafer 34 and chucking of the same within a single chamber (i.e., the processing chamber 22), the wafer can be processed efficiently. Thus, the wafer processing apparatus according to the first embodiment enables desired wafer processing in a high-yield and efficient manner through use of an electrostatic chuck as means for securing a wafer.

Although in the first embodiment the heater 36 is used as means for heating the wafer 34, the heating means is not limited to the heater. A lamp annealing method, a microwave annealing method, or an induction heating method, all of which enable more efficient heating, may also be employed as wafer heating means.

Second Embodiment

Figure 9A:
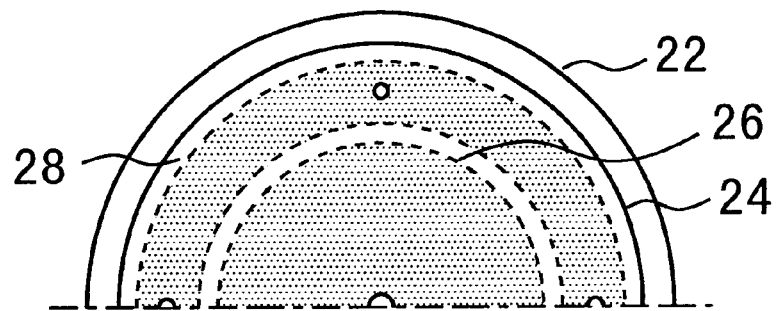
FIG. 9A is a cross-sectional view taken along a plane A—A shown in FIG. 9B and showing a main part of a wafer processing apparatus according to a second embodiment of the present invention.
Figure 9B:
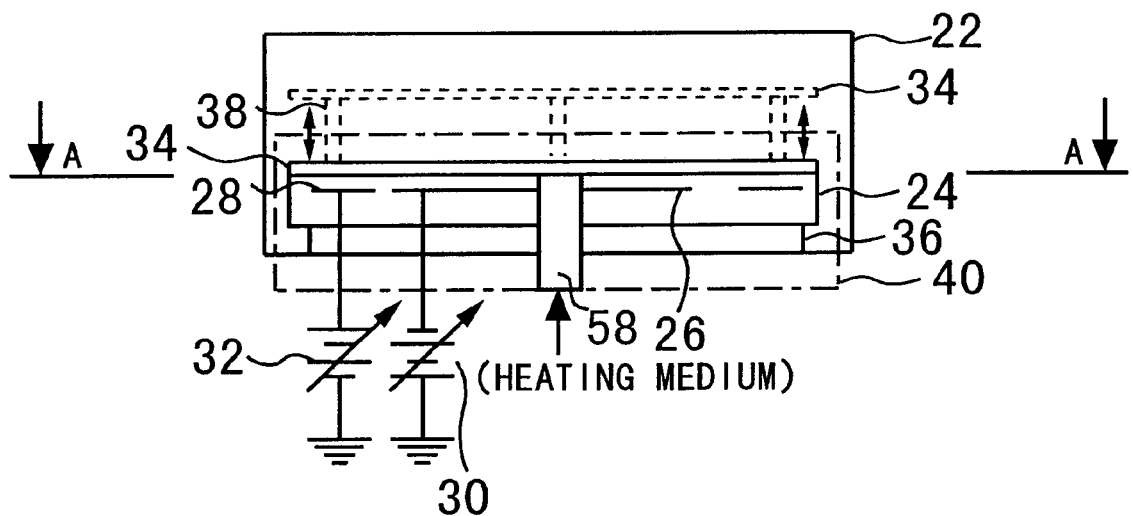
FIG. 9B is a front view of the wafer processing apparatus according to the second embodiment of the present invention.

FIGS. 9A and 9B show a wafer processing apparatus according to a second embodiment of the present invention. In FIGS. 9A and 9B, the elements which are identical to those shown in FIG. 2 are assigned the same reference numerals, and repetition of their explanations is omitted here.

As shown in FIGS. 9A and 9B, the wafer processing apparatus according to the second embodiment is equipped with a heating medium inlet port 58. The heating medium inlet port 58 is used for introducing a gas having superior heat transfer characteristics, such as a He gas, tot he space between the wafer 34 and the dielectric plate 24.

The operation of the wafer processing apparatus according to the second embodiment will now be described by reference to FIGS. 5 to 7 and FIGS. 9A and 9B. In the second embodiment, transportation of the wafer 34 and application of a voltage to the electrostatic chuck 40 are carried out in the same way as that in the first embodiment.

Namely, when the wafer processing apparatus according to the second embodiment starts processing, the wafer 34 is transported to the interior of the processing chamber 22 by means of the unillustrated transport robot. After having been passed to the pusher 38 from the transport robot, the wafer 34 is placed on the dielectric plate 24, which has been pre-heated to and maintained at a predetermined temperature by the heater 36.

The wafer processing apparatus diminishes the stress acting on the wafer 34, through pre-heating of the wafer 34 (in step S10 shown in FIG. 5, and see FIG. 6B). In the second embodiment, during the pre-heating process a gas having superior heat transfer characteristics, such as a He gas, is introduced into the space between the wafer 34 and the dielectric plate 24 by way of the heating medium inlet port 58. As a result, heat of the dielectric plate 24 is immediately transferred to the wafer 34, thereby resulting in quick heating of the wafer 34. The wafer processing apparatus according to the second embodiment enables shortening of the time required for pre-heating the wafer 34 (i.e., the time required for performing processing relating to step S10 shown in FIG. 5).

Since the wafer processing apparatus according to the second embodiment causes the wafer 34 to be held on the dielectric plate 24 through the foregoing processing operations, strain in the wafer 34 can be immediately relieved after heating of the wafer 34 is commenced. Therefore, the wafer processing apparatus according to the second embodiment enables prevention of fracture of the wafer 34 and can achieve superior processing capability and high stability.

Although in the second embodiment the heater 36 is employed as means for heating the wafer 34, the heating means is not limited to the heater. A lamp annealing method, a microwave annealing method, or an induction heating method, all of which enable more efficient heating, may also be employed as wafer heating means.

Although in the second embodiment only one heating medium inlet port 58 is provided, the present invention is not limited to such a configuration; the wafer processing apparatus may be provided with a plurality of heating medium inlet ports 58. Further, although in the second embodiment a He gas is exemplified as a heating medium having good heat transfer characteristics, the heating medium is not limited to the He gas. A rare gas such as Ne gas or Ar gas; $H_2$ gas; $N_2$ gas; or $O_2$ gas may also used as the heating medium.

Third Embodiment

Figure 10A:
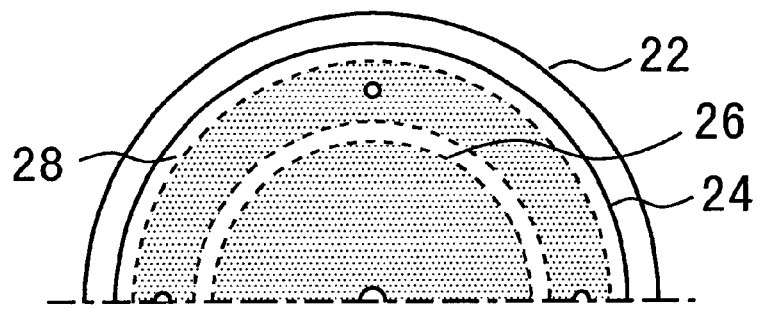
FIG. 10A is a cross-sectional view taken along a plane A—A shown in FIG. 10B and showing a main part of a wafer processing apparatus according to a third embodiment of the present invention.
Figure 10B:
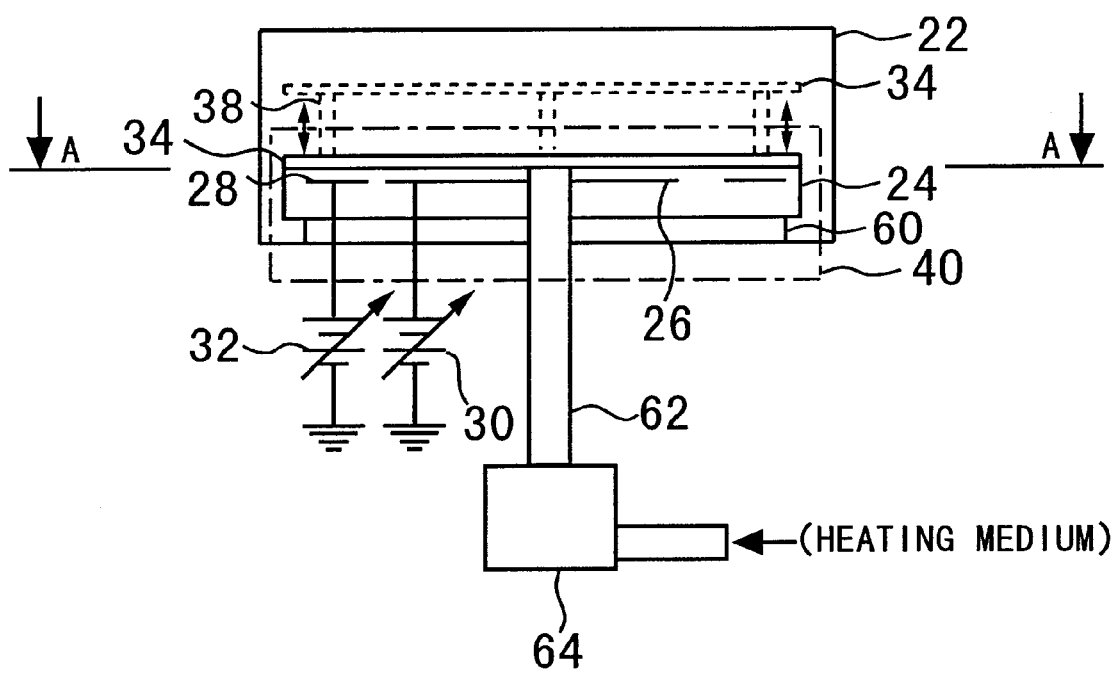
FIG. 10B is a front view of the wafer processing apparatus according to the third embodiment of the present invention.

FIGS. 10A and 10B show a wafer processing apparatus according to a third embodiment of the present invention. In FIGS. 10A and 10B, the elements which are the same as those shown in FIG. 2 are assigned the same reference numerals, and repetition of their explanations is omitted.

As shown in FIGS. 10A and 10B, the wafer processing apparatus comprises a heat insulator 60 interposed between the dielectric plate 24 and the processing chamber 22. Further, the wafer processing apparatus comprises a heating medium inlet pipe 62 for introducing a heating medium; more specifically, a gas having superior heat transfer characteristics such as an He gas, into the space between the wafer 34 and the dielectric plate 24. The heating medium inlet pipe 62 is connected to a gas heating device 64, which heats the gas having superior heat transfer characteristics to a desired temperature. In the third embodiment, the gas that is pre-heated by the gas heating device 64 is introduced via the heating medium inlet pipe 62.

The operation of the wafer processing apparatus according to the third embodiment will be described by reference to FIGS. 5 to 7 and FIGS. 10A and 10B. In the third embodiment, transportation of the wafer 34 and application of a voltage to the electrostatic chuck 40 are carried out in the same manner as that in the first and second embodiments.

Namely, when the wafer processing apparatus commences processing, the wafer 34 is transported to the interior of the processing chamber 22 by means of the unillustrated transport robot. After having been passed to the pusher 38 from the transport robot, the wafer 34 is placed on the dielectric plate 24.

The wafer processing apparatus according to the third embodiment introduces, into the space between the wafer 34 and the dielectric plate 24 by way of the heating medium inlet pipe 62, a heating medium (e.g., an He gas) that has been heated beforehand to a predetermined temperature by the gas heating device 64, thereby directly heating the wafer 34. As in the case where processing relating to step S10 shown in FIG. 5 is performed; i.e., where pre-heating of the wafer 34 shown in FIG. 6B is performed, a warp in the wafer 34 resulting from heating is diminished through the foregoing heating process.

As mentioned above, the wafer processing apparatus directly heats the wafer 34 through use of the thus-heated heating medium, thereby eliminating the warp from the wafer 34 immediately after heating of the wafer 34 has been commenced. Accordingly, as in the case of the wafer processing apparatus according to the second embodiment, the apparatus can achieve superior processing capability and high stability in addition to preventing fracture of the wafer 34.

Since the wafer processing apparatus according to the third embodiment uses only a heating medium as means for heating the wafer 34, the wafer processing apparatus may be embodied in a structure simpler than the wafer processing apparatus according to the second embodiment that uses both the heating medium and the heater.

Although in the third embodiment the wafer 34 is heated through use of the pre-heated He gas, the heating medium used for heating the wafer 34 is not limited to a He gas. A rare gas such as Ne or Ar; $H_2$ gas; $N_2$ gas; or $O_2$ gas may also be used as the heating medium. Although in the third embodiment only one heating medium inlet pipe 62 is provided, the present invention is not limited to such a configuration. The wafer processing apparatus may be provided with a plurality of heating medium inlet pipes 62.

Fourth Embodiment

Figure 1:
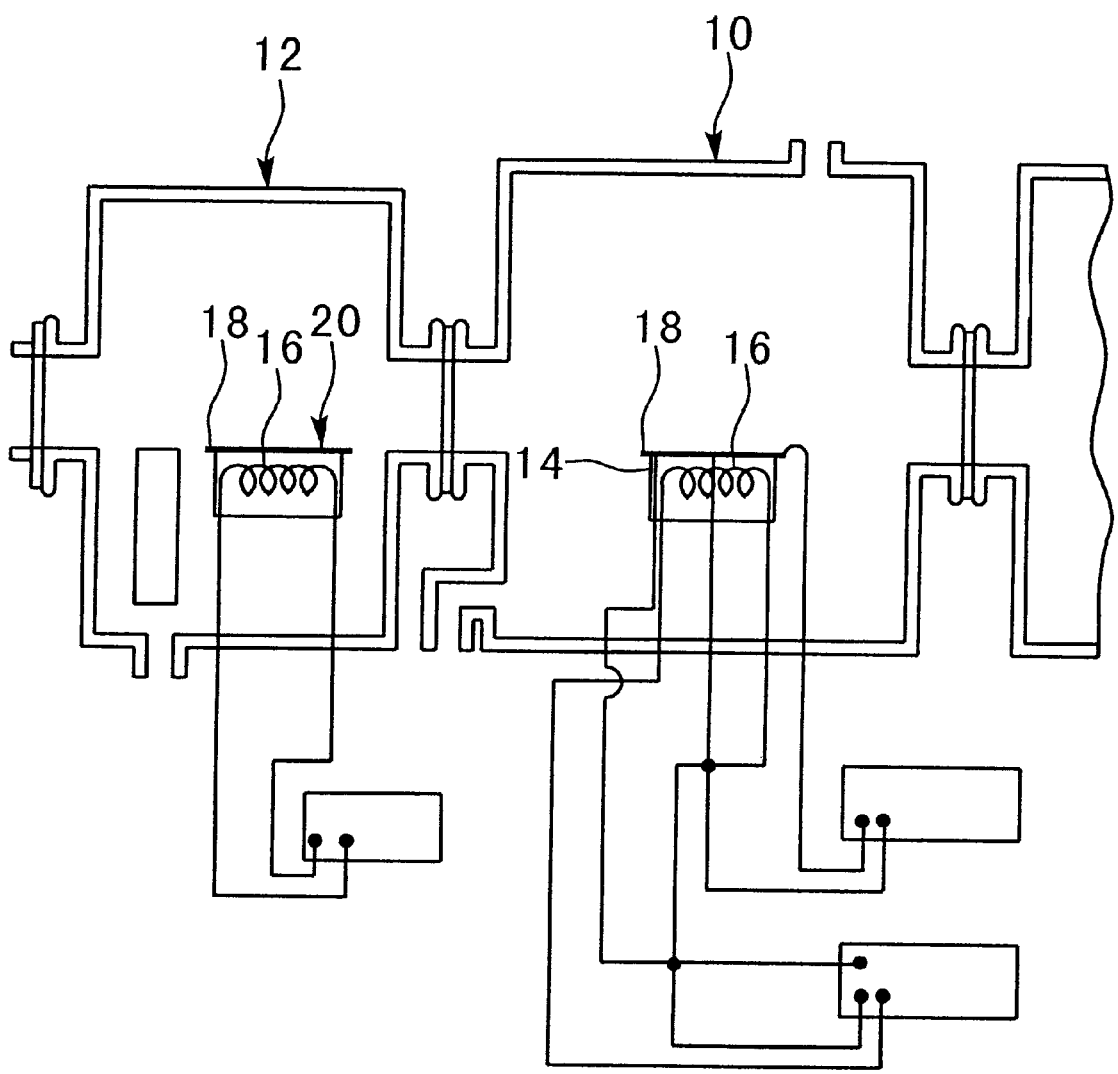
FIG. 1 is a schematic view showing a conventional wafer processing apparatus.
Figure 11:
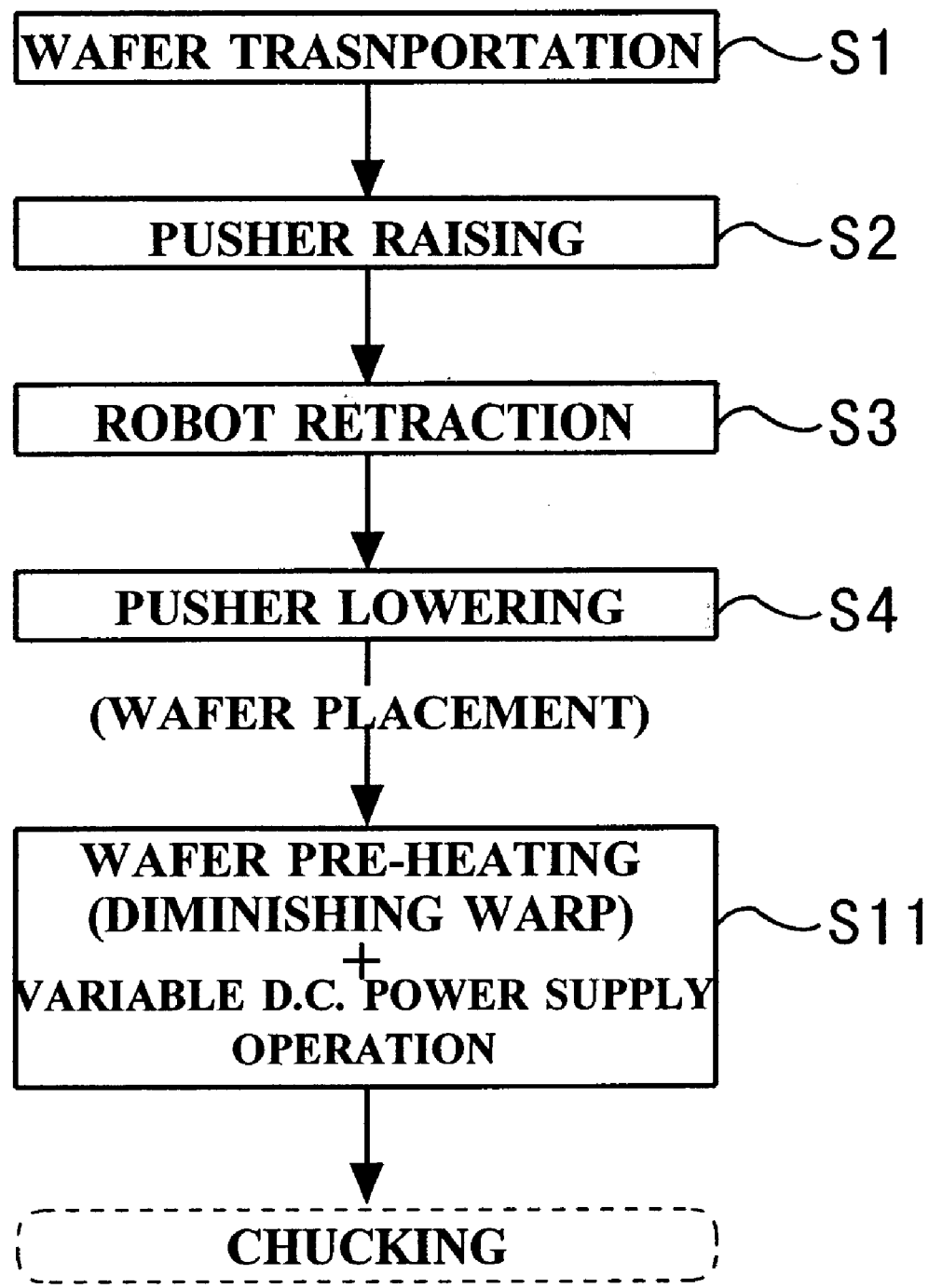
FIG. 11 is a flowchart for describing an operation of a wafer processing apparatus according to a fourth embodiment of the present invention.

A wafer processing apparatus according to a fourth embodiment is identical in structure to the wafer processing apparatus according to the first embodiment (FIG. 1) or the second embodiment (FIG. 9). The fourth embodiment is embodied when the wafer processing apparatus having the aforementioned structure operates according to a flowchart shown in FIG. 11. In FIG. 11, those steps identical with those shown in FIG. 5 are assigned the same reference numerals, and repetition of their explanations is omitted here.

As shown in FIG. 11, in the wafer processing apparatus according to the fourth embodiment, the wafer 34 is placed on the dielectric plate 24 in step S4, and then processing relating to step S11 is performed.

In step S11, the wafer 34 is pre-heated so as to eliminate a warp, as well as voltages are applied from the first and second variable D.C. power supplies 30 and 32 in order to improve heating efficiency.

FIGS. 12A to 12C are timing charts for describing application of voltages to the electrostatic chuck 40 of the wafer processing apparatus. In FIGS. 12A to 12C, as in the case of FIGS. 7A to 7C, reference numeral 52 designates a phase during which the wafer 34 is placed on the dielectric plate 24; reference numeral 54 designates a phase during which the wafer 34 is pre-heated; and reference numeral 56 designates a phase during which the wafer 34 is subjected to processing steps such as etching and film-growth processing.

The operation of the wafer processing apparatus according to the fourth embodiment will be described by reference to FIGS. 2 and 11 and FIGS. 12A to 12C.

When the wafer processing apparatus commences processing, the wafer 34 is placed on the dielectric plate 24 by means of the transport robot (during the phase 52 shown in FIGS. 12A to 12C). As in the case of the first embodiment, the wafer 34 is heated by the heater 36 during the pre-heating phase 54. In order to improve the efficiency of heating the wafer 34, the wafer processing apparatus according to the fourth embodiment applies voltages to the first and second electrodes 26 and 28 by the following method after beginning of the pre-heating phase 54.

In the fourth embodiment, the first and second variable D.C. power supplies 30 and 32 are controlled by the controller 98 to apply voltages of opposite phases to the first and second electrodes 26 and 28 after beginning of the pre-heating phase 54. As shown in FIGS. 12A and 12B, the voltages to be applied are changed stepwise to greater voltages during the period corresponding to the pre-heating phase 54.

FIG. 12C shows variations in the attraction force between the wafer 34 and the dielectric plate 24. As shown in FIG. 12C, the attraction force acting on the wafer 34 tends to increase with an increase in the voltages applied to the first and second electrodes 26 and 28. At the beginning of the pre-heating phase 54, the attraction force acting on the wafer 34 is weak, and hence the wafer 34 can expand freely. As a result, the warp in the wafer 34 resulting from heating is relieved at the beginning of the pre-heating phase 54.

As a result of the electrostatic force between the wafer 34 and the dielectric plate 24, the wafer 34 and the dielectric plate 24 adhere closely together, thus improving thermal conduction therebetween. As mentioned above, the electrostatic force acting on the wafer 34 during the pre-heating phase 54 enables high-speed heating of the wafer 34. Accordingly, the wafer processing apparatus according to the fourth embodiment enables a rapid increase in the temperature of the wafer 34 to a predetermined temperature while eliminating a warp in the wafer 34. Thus, the fourth embodiment yields the advantage of having superior processing capability and high stability while preventing development of a fracture in the wafer 34. Further, the fourth embodiment also yields the advantage that the structure thereof can be embodied without modification of that of the conventional wafer processing apparatus (shown in FIG. 2).

In the fourth embodiment, the voltages applied to the first and second electrodes 26 and 28 are increased stepwise during the pre-heating phase 54. However, the profiles of application voltages is not limited to such as those employed in the fourth embodiment. For instance, the application voltages may be changed at gentle gradients.

Further, although in the fourth embodiment the first variable D.C. power supply 30 supplies a positive voltage to the first electrode 26 while the second variable D.C. power supply 32 supplies a negative voltage to the second electrode 28, the polarities of these application voltages may be reversed.

Moreover, although in the fourth embodiment a heating medium is not introduced into the space between the dielectric plate 24 and the wafer 34, a heating medium such as a He gas may be introduced into the space between the dielectric plate 24 and the wafer 34. Introduction of such a heating medium may further improve the rate at which the temperature of the wafer 34 is increased.

Fifth Embodiment

FIGS. 13A to 13C are timing charts for describing application of voltages to the electrostatic chuck 40 of the wafer processing apparatus according to a fifth embodiment. In FIGS. 13A to 13C, as in the case of FIGS. 7A to 7C, the phase 52 corresponds to a time interval during which the wafer 34 is placed on the dielectric plate 24; the phase 54 corresponds to a pre-heating operation phase for pre-heating the wafer 34; and the phase 56 corresponds to a wafer processing phase during which the wafer 34 is subjected to processing steps such as etching and film-growth processing.

The operation of the wafer processing apparatus according to the fifth embodiment will be described by reference to FIGS. 2, 6, 11, and 13A to 13C.

When the wafer processing apparatus commences processing, the transport robot places the wafer 34 on the dielectric plate 24 (during the phase 52 shown in FIGS. 13A to 13C). During the pre-heating phase 54, as in the case of the first embodiment, the wafer 34 is heated by the heater 36. In order to improve the efficiency in heating the wafer 34, the wafer processing apparatus applies voltages to the first and second electrodes 26 and 28 by the following method after the beginning of the pre-heating phase 54.

In the fifth embodiment, the first and second variable D.C. power supplies 30 and 32 are controlled by the controller 98 to apply voltages of opposite phase to the first and second electrodes 26 and 28 after the beginning of the pre-heating phase 54. As shown in FIGS. 13A and 13B, the polarities of the voltages are periodically reversed, and the voltages are increased stepwise during the pre-heating phase 54.

FIG. 13C shows variations in the attraction force between the wafer 34 and the dielectric plate 24. As shown in FIG. 13C, the attraction force acting on the wafer 34 tends to increase as the voltages applied to the first and second electrodes 26 and 28 are increased while periodically reversing the direction thereof. After the pre-heating phase 54 has been commenced, during an initial stage in which the attraction force acting on the wafer 34 is comparatively small and every time the attraction force becomes zero in the reverse process, the wafer 34 can expand so as to relieve strain.

In the fifth embodiment, electrostatic force is repeatedly generated between the wafer 34 and the dielectric plate 24. In this case, thermal conduction between the wafer 34 and the dielectric plate 24 is improved, thereby enabling quick heating of the wafer 34. Accordingly, the wafer processing apparatus according to the fifth embodiment enables quick heating of the wafer 34 to a predetermined temperature while quickly relieving the warp in the wafer 34. Thus, the fifth embodiment can embody superior processing capability and high stability while preventing development of a fracture of the wafer 34. Further, the wafer processing apparatus according to the fifth embodiment also yields the advantage that the structure thereof can be embodied without modification of that of the conventional wafer processing apparatus (shown in FIG. 2).

Figure 14A:
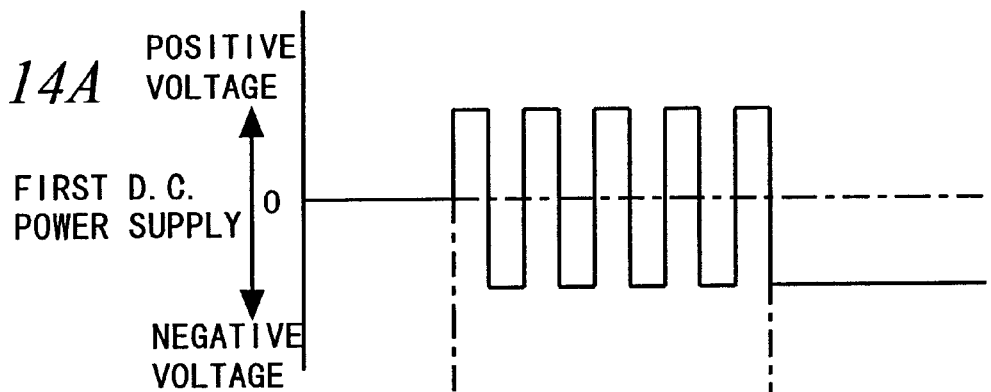
FIGS. 14A through 14C are timing charts for describing an operation of a wafer processing apparatus which is a modification of the fifth embodiment of the present invention.
Figure 14B:
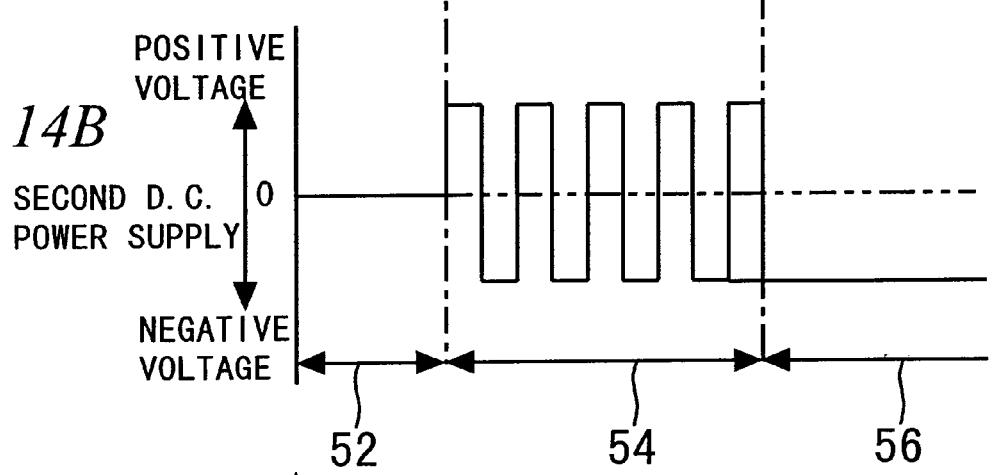
Figure 14C:
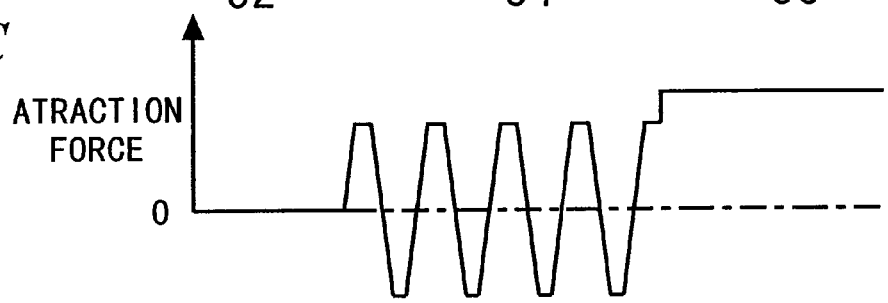

In the fifth embodiment, the voltages applied to the first and second electrodes 26 and 28 are increased stepwise while the polarities of the voltages are reversed. However, the waveforms of application voltages is not limited to such as those employed in the fourth embodiment. For instance, as shown in FIGS. 14A to 14C, the voltages applied to the first and second electrodes 26 and 28 may assume the same amplitude while periodically reversing the polarities.

Further, although in the fifth embodiment the first and second variable D.C. power supplies 30 and 32 change application voltages in rectangular waveforms, the waveform of the application voltages is not limited thereto; the voltages supplied from the first and second variable D.C. power supplies 30 and 32 may be changed so as to assume a sinusoidal waveform or a triangular waveform.

Although in the fifth embodiment a heating medium is not introduced into the space between the dielectric plate 24 and the wafer 34, a heating medium such as a He gas may be introduced into the space between the dielectric plate 24 and the wafer 34, as in the case of the second or third embodiments. Introduction of such a heating medium may further improve the rate at which the temperature of the wafer 34 is increased.

Sixth Embodiment

Figure 15A:
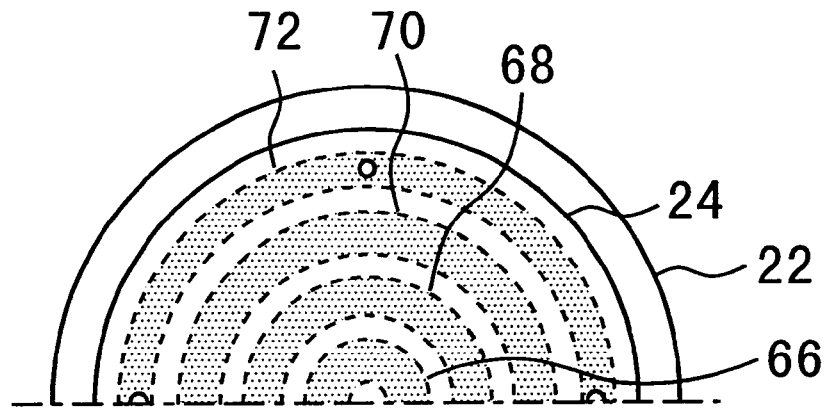
FIG. 15A is a cross-sectional view taken along a plane A—A shown in FIG. 15B and showing a main part of a wafer processing apparatus according to a sixth embodiment of the present invention.
Figure 15B:
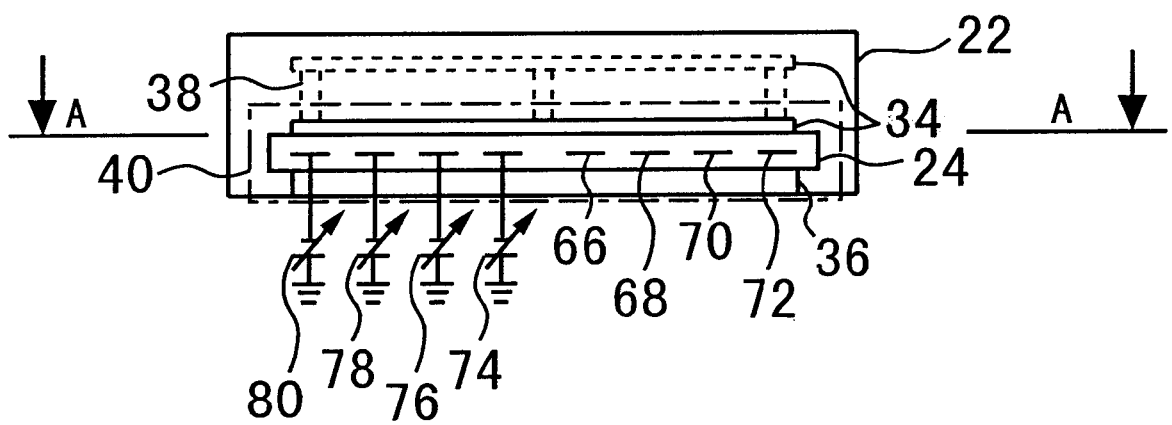
FIG. 15B is a front view of the wafer processing apparatus according to the sixth embodiment of the present invention.

FIGS. 15A and 15B show a wafer processing apparatus according to a sixth embodiment of the present invention. In FIGS. 15A and 15B, those elements which are the same as those shown in FIG. 2 are assigned the same reference numerals, and repetition of their explanations is omitted.

As shown in FIGS. 15A and 15B, the wafer processing apparatus according to the sixth embodiment comprises a first annular electrode 66, a second annular electrode 68, a third annular electrode 70, and a fourth annular electrode 72. These first to fourth electrodes 66, 68, 70 and 72 are concentrically embedded from the center to the outer periphery of the apparatus in that order in the dielectric plate 24. The first through fourth electrodes 66, 68, 70 and 72 are connected to a first through fourth variable D.C. power supplies 74, 76, 78, and 80, respectively. These first through fourth variable D.C. power supplies 74, 76, 78 and 80 are controlled by a controller 98 to apply arbitrary D.C. voltages to the first through fourth electrodes 66, 68, 70 and 72, respectively.

FIGS. 16A to 16H are diagrams for describing application of voltages to the electrostatic chuck 40 disposed in the wafer processing apparatus according to the sixth embodiment. In FIGS. 16A to 16H, the phase 52 corresponds to a time interval during which the wafer 34 is placed on the dielectric plate 24; the phase 54 corresponds to a pre-heating operation phase for pre-heating the wafer 34; and the phase 56 corresponds to a wafer processing phase during which the wafer 34 is subjected to processing steps such as etching and film-growth processing.

An area 82 shown in FIG. 16A corresponds to a time interval during which attraction force develops between the first electrode 66 and the second electrode 68 by application of a predetermined voltage to the first electrode 66 from the first variable D.C. power supply 74. Arrows 83 shown in FIG. 16E depict attraction force developing in the area 82.

An area 84 shown in FIG. 16B corresponds to a time interval during which attraction force develops between the second electrode 68 and the third electrode 70 by application of a predetermined voltage to the second electrode 68 from the second variable D.C. power supply 76. Arrows 84 shown in FIG. 16B depict attraction force developing in the area 84.

An area 86 shown in FIG. 16C corresponds to a time interval during which attraction force develops between the third electrode 70 and the fourth electrode 72 by application of a predetermined voltage to the third electrode 70 from the third variable D.C. power supply 78. Arrows 87 shown in FIG. 16G depict attraction force developing in the area 86.

Figure 17:
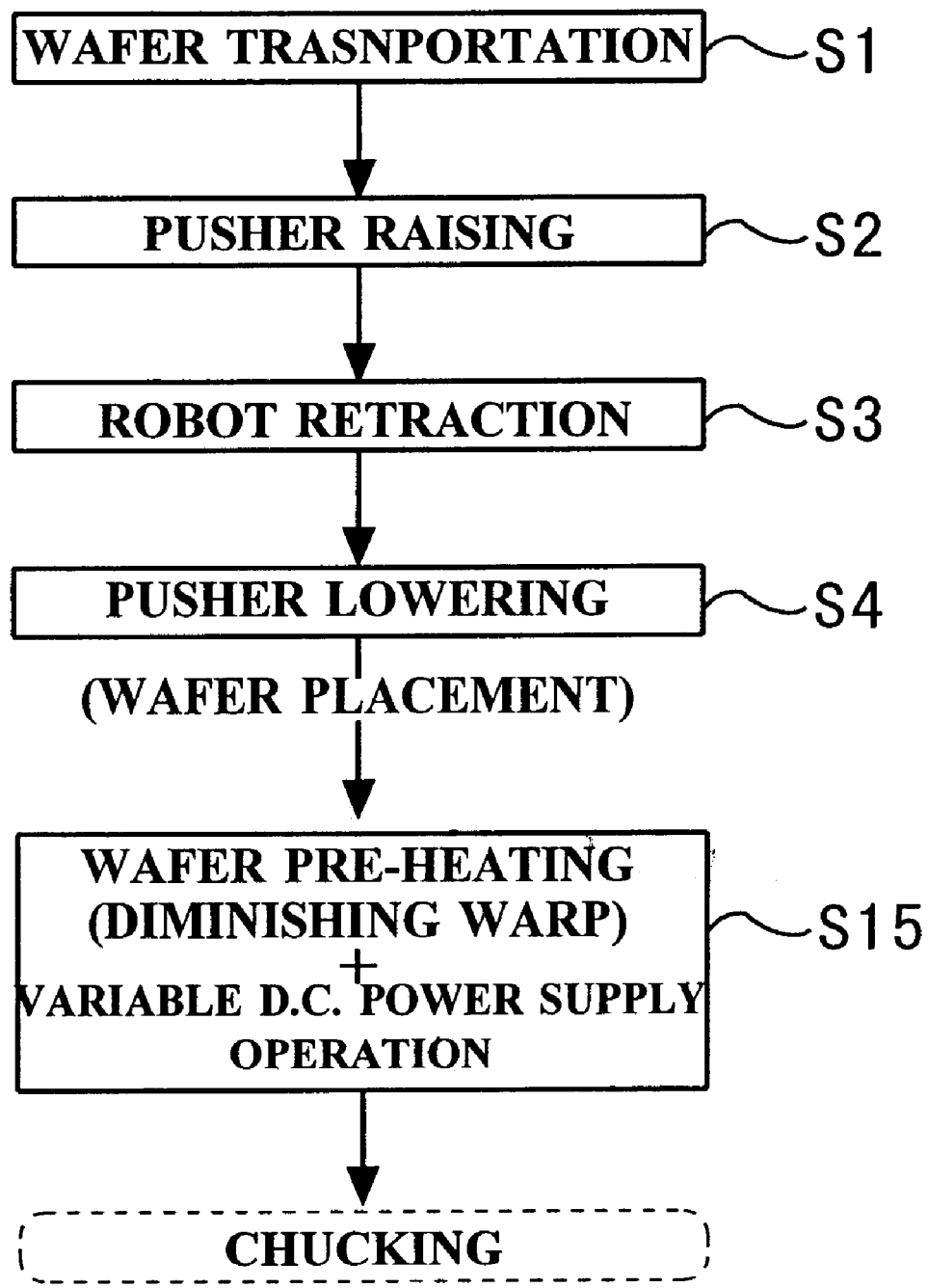
FIG. 17 is a flowchart for describing an operation of the wafer processing apparatus according to the sixth embodiment of the present invention.

FIG. 17 is a flowchart for describing the operation of the wafer processing apparatus according to the sixth embodiment. In FIG. 17, those steps identical to those steps shown in FIG. 5 are assigned the same reference numerals. As shown in FIG. 17, in the wafer processing apparatus according to the sixth embodiment, after the wafer 34 has been placed on the dielectric plate 24 in step S4, processing relating to step S15 is performed. In step S15, simultaneously with heating of the wafer 34 for the purpose of relieving a warp arisen therein, voltage applying operation is carried out by the first to fourth variable D.C. power supplies 74, 76, 78, and 80 in order to improve heating efficiency.

The operation of the wafer processing apparatus according to the sixth embodiment will be described in detail by reference to FIGS. 15 through 17.

When the wafer processing apparatus according to the sixth embodiment commences processing, the transport robot places the wafer 34 on the dielectric plate 24 (during the phase 52 shown in FIGS. 16A to 16D). During the pre-heating phase 54, as in the case of the first embodiment, the wafer 34 is heated by the heater 36. In the sixth embodiment, after the beginning of the pre-heating phase 54, desired voltages are applied to the first through fourth electrodes 66, 68, 70, and 72 from the first through fourth variable D.C. variable power supplies 74, 76, 78, and 80 according to the following method in order to improve the heating efficiency.

During the pre-heating phase 54, a predetermined voltage is applied to the first electrode 66 by the first variable D.C. power supply 74 at first (the first attraction area 82). As a result, a potential difference develops between the first electrode 66 and the second electrode 68, thus inducing attraction force 83 (see FIG. 16E). At this time, since no attraction force acts on the wafer 34 except at the center thereof, the warp associated with heating takes the form of radial expansion. Accordingly, no great stress acts on the wafer 34 during the time interval of the first attraction area 82.

Next, during the pre-heating phase 54, a predetermined voltage is applied to the second electrode 68 by the second variable D.C. power supply 76 (during the time interval of the second attraction area 84). As a result, a potential difference develops between the second electrode 68 and the third electrode 70, thus inducing attraction force 85 (see FIG. 16F). At the time when the second attraction area 84 is commenced, the warp arising in the vicinity of the center of the wafer 34 has already been diminished through the processing during the first attraction area 82. More specifically, at the time when the second attraction area 82 is commenced, the warp of the wafer 34 remains in only the vicinity of periphery thereof. During the second attraction area 84, no attraction force acts on the periphery of the wafer 34, and hence the warp still remaining in the wafer 34 takes the form of radial expansion, so that the warp in the wafer 34 is further diminished.

During the pre-heating phase 54, then a predetermined voltage is applied to the third electrode 70 by the third variable D.C. power supply 78 (during the time interval of the third attraction area 86). As a result, a potential difference develops between the third electrode 70 and the fourth electrode 72, thereby inducing attraction force 87 (see FIG. 16G). At the time when the third attraction area 88 begins, the warp in the inner peripheral portion of the wafer 34 has already been sufficiently diminished, and slight warp still remains in only the vicinity of periphery of the wafer 34.

A warp such as that still remaining in the wafer 34 can be relieved even after the beginning of the third attraction area 86 by radial expansion of the wafer 34. Accordingly, the warp in the wafer 34 can be substantially eliminated through the foregoing voltage application processes.

Further, when the electrodes for generating electrostatic force is divided as in the sixth embodiment, the warp arising in the wafer 34 may be spread to a wide area. Therefore, the wafer processing apparatus according to the sixth embodiment diminishes development of a fracture of the wafer 34 more effectively than do the wafer processing apparatus according to the first through fifth embodiments.

As mentioned previously, the sixth embodiment enables heating of the wafer 34 to a predetermined temperature while attraction force is induced in the wafer 34, relieving the warp in the wafer 34 toward an outer peripheral direction, and spreading the force acting on the wafer. Thus, the wafer processing apparatus according to the sixth embodiment reliably prevents development of fracture of the wafer 34 while ensuring superior processing capability and high stability.

Figure 18:
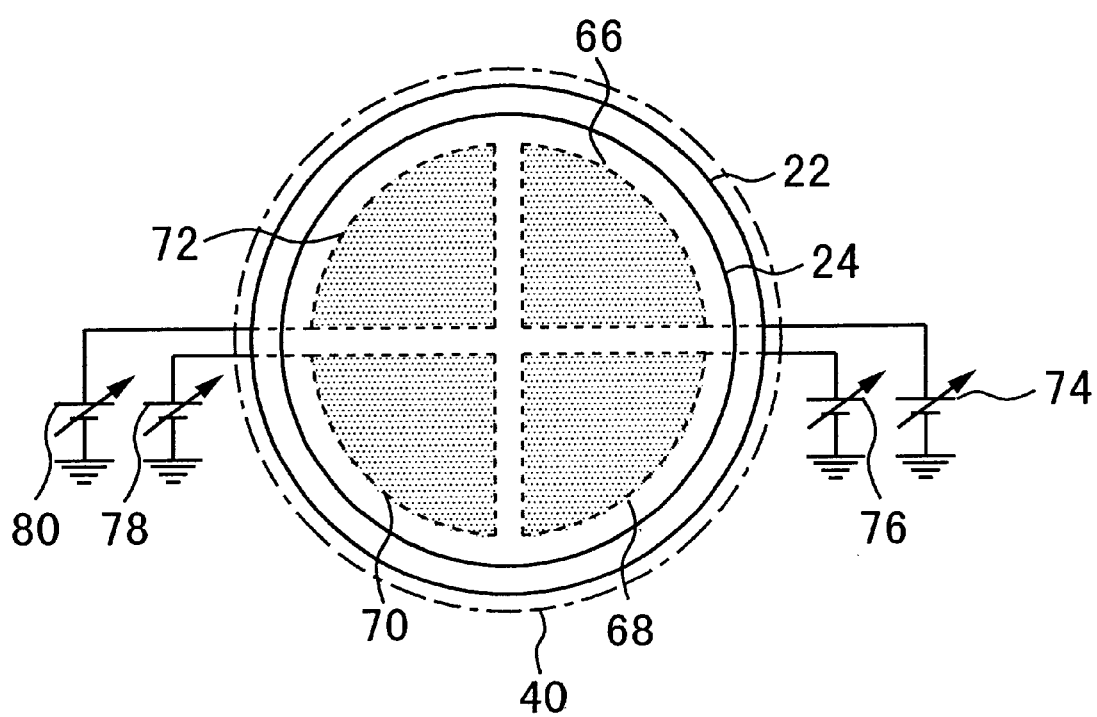
FIG. 18 is a plane view showing a main part of a wafer processing apparatus which is a modification of the sixth embodiment of the present invention.

In the sixth embodiment, the first through fourth electrodes 66, 68, 70, and 72 that are embedded in the dielectric plate 24 assume an annular shape. However, the first through fourth electrodes 66, 68, 70, and 72 are not limited to this shape. As shown in FIG. 18, the first through fourth electrodes 66, 68, 70, and 72 may be formed into sector-shaped electrodes, which are partitioned from one another along radially-extending boundaries. In such a case, the electrostatic force acting on the wafer 34 may be rotated clockwise by performing the voltage application processes shown in FIGS. 16A to 16H. Through rotation of the attraction force acting on the wafer 34, the warp in the wafer 34 is effectively diminished while being spread. Therefore, the wafer processing apparatus having the configuration shown in FIG. 18 also yields the same advantageous result as that yielded by the wafer processing apparatus according to the sixth embodiment.

FIGS. 19A to 19E are illustrations for describing another example of voltage application process applicable to the wafer processing apparatus according to the sixth embodiment (shown in FIGS. 15A and 15B). As shown in FIGS. 19A to 19D, through the voltage application processes shown in the drawings, the first through fourth variable D.C. power supplies 74, 76, 78 and 80 are controlled by a controller 98 to supply different voltages to the first through fourth electrodes 66, 68, 70, and 72 during the pre-heating phase 54. More specifically, the first through fourth variable D.C. power supplies 74, 76, 78, and 80 control application voltages such that the voltages applied to the first to fourth electrodes 66, 68, 70, and 72 become increasingly smaller in sequence from the first electrode 66 to the fourth electrode 72.

In FIG. 19E, the lengths of arrows 88 represent the magnitude of attraction force developing between the first electrode 66 and the second electrode 68 as a result of the foregoing voltage control operation; the lengths of arrows 90 represent the magnitude of attraction force developing between the second electrode 68 and the third electrode 70 as a result of the foregoing voltage control operation; and the lengths of arrows 92 represent the magnitude of attraction force developing between the third electrode 70 and the fourth electrode 72 as a result of the foregoing voltage control operation. As shown in FIG. 16E, the magnitude of the attraction force acting on the wafer 34 becomes smaller in a direction from the center to the periphery of the wafer 34 according to the foregoing voltage control operation.

In a case where the attraction force having such an intensity distribution acts on the wafer 34, a warp arising in the wafer 34 during the pre-heating phase 54 is relieved in the direction from the center to the periphery of the wafer 34. Therefore, through the voltage control operations shown in FIGS. 19A to 19D, advantageous results that are the same as those yielded through the voltage control operations shown in FIGS. 16A to 16D can be yielded.

In the sixth embodiment, no heating medium is introduced between the wafer 34 and the dielectric plate 24. However, the present invention is not limited to such an embodiment. As in the case of the second and third embodiments, a heating medium such as He gas may be introduced between the wafer 34 and the dielectric plate 24. Such a configuration may enable much faster heating of the wafer 34.

The wafer processing apparatus shown in FIGS. 15A and 15B or FIG. 18 comprises four electrodes. However, the number of electrodes is not limited to four. At least three electrodes realize advantageous results which are the same as those yielded by the wafer processing apparatus shown in FIGS. 15A and 15B or FIG. 18.

Seventh Embodiment

Figure 20A:
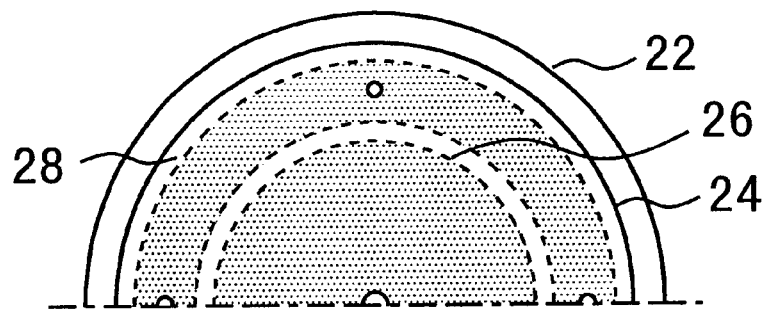
FIG. 20A is a cross-sectional view taken along a plane A—A shown in FIG. 20B and showing a main part of a wafer processing apparatus according to a seventh embodiment of the present invention.
Figure 20B:
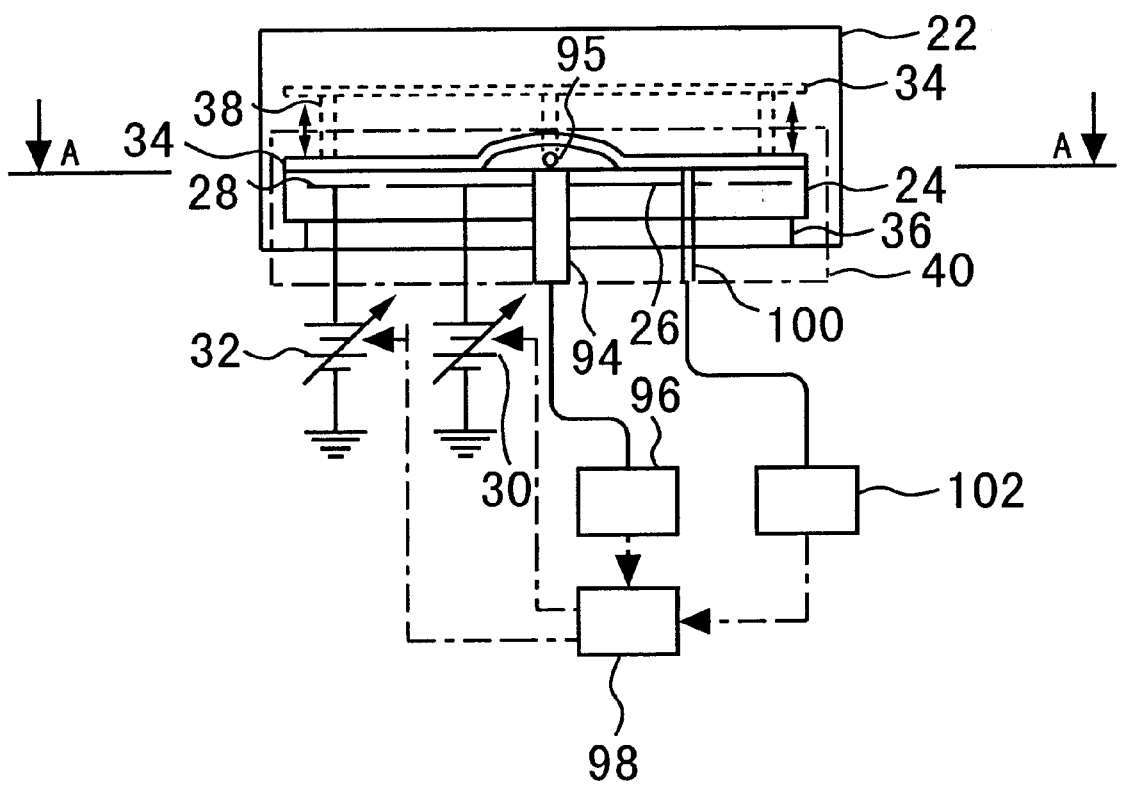
FIG. 20B is a front view of the wafer processing apparatus according to the seventh embodiment of the present invention.

FIGS. 20A and 20B show a wafer processing apparatus according to a seventh embodiment of the present invention. In FIGS. 20A and 20B, those elements which are the same as those shown in FIG. 2 are assigned the same reference numerals, and repetition of their explanations is omitted.

As shown in FIGS. 20A and 20B, the wafer processing apparatus is equipped with a gap sensor 94 which is embedded in the dielectric plate 24 in order to measure a gap between the dielectric plate 24 and the wafer 34. In a case where a gap 95 appears between the wafer 34 and the dielectric plate 24 as a result of heating of the wafer 34, the sensor 94 measures the gap 95. A signal output from the gap sensor 94 is supplied to a first detector 96, where the signal received from the gap sensor 94 is converted into an arbitrary signal such as a voltage signal and is supplied to a computation instruction device 98.

The wafer processing apparatus according to the seventh embodiment comprises a thermometer 100 embedded in the dielectric plate 24. The thermometer 100 measures the temperature of the wafer 34 and supplies the thus-measured value to a second detector 102, where the value measured by the thermometer 100 is converted into a desired signal such as a voltage signal and is transmitted to the computation instruction device 98.

In the wafer processing apparatus according to the seventh embodiment, the voltages output from the first and second variable D.C. power supplies 30 and 32; i.e., the voltages applied to the first and second electrodes 26 and 28, are controlled through feedback. On the basis of the signal supplied from the first detector 94 specifying the gap 95 between the wafer 34 and the dielectric plate 24 and the signal supplied from the second detector 102 specifying the temperature of the wafer 34, the computation instruction device 98 performs control operations required for feedback.

Figure 21:
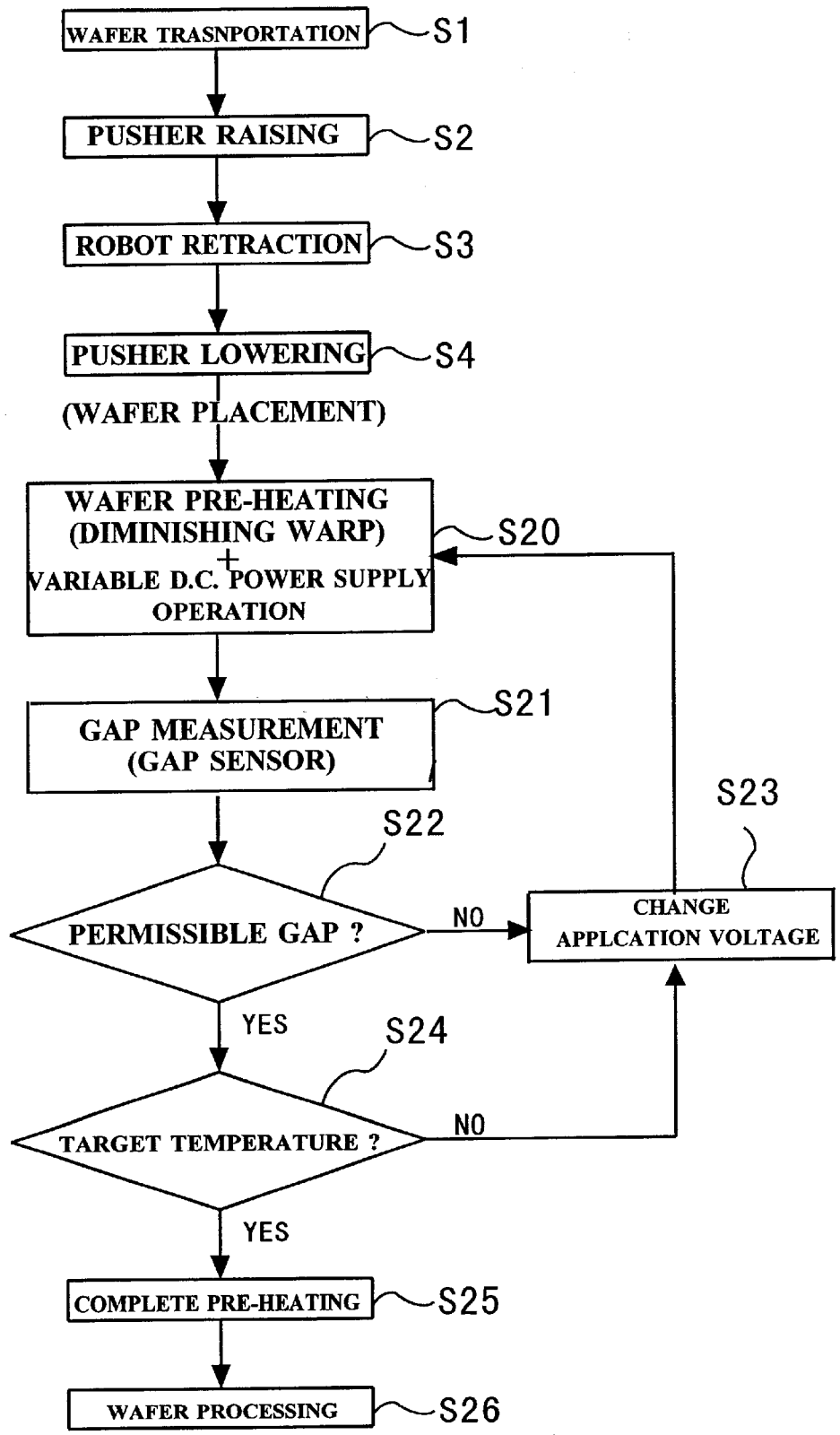
FIG. 21 is a flowchart for describing an operation of the wafer processing apparatus according to the seventh embodiment of the present invention.

By reference to FIGS. 20A, 20B and 21, the operation of the wafer processing apparatus according to the seventh embodiment will now be described. FIG. 21 shows a flowchart for describing the operation of the wafer processing apparatus according to the seventh embodiment. In FIG. 21, those steps identical with those shown in FIG. 5 are assigned the same reference numerals, and repetition of their explanations is omitted here.

As shown in FIG. 21, the wafer processing apparatus according to the seventh embodiment performs processing relating to step S20 after the wafer 34 has been placed on the dielectric plate 24 through processing relating to step S4.

In step S20, simultaneously with heating of the wafer 34 by the heater 36 for the purpose of relieving the warp arising therein, the first and second variable D.C. power supplies 30 and 32 supply voltages to the first and second electrodes 26 and 28 in order to improve heating efficiency. More specifically, the first and second variable D.C. power supplies 30 and 32 supply predetermined voltages to the first and second electrodes 26 and 28, thereby heating the wafer 34 by the heater 36 while the wafer 34 is held on the dielectric plate 24.

The warp arising in the wafer 34 during the heating process appears in the form of expansion of the wafer 34. In the electrostatic chuck of two-electrode type shown in FIGS. 20A and 20B, the expansion of the wafer 34 results in a bulging warp arising in the center of the wafer 34. As a result, such warp induces the gap 95 arising between the wafer 34 and the dielectric plate 24.

In step S21, the gap sensor 94 measures the gap 95 caused by the warp in the wafer 34. The result of measurement of the gap 95 by the gap sensor 94 is sent to the first detector 96, where the result is converted into a signal such as a voltage and is supplied to the computation instruction device 98.

In step S22, a determination is made as to whether or not the gap 95 measured in step S21 is within a predetermined permissible size. If the gap 95 is determined to exceed the permissible size, processing relating to step S23 is performed. In contrast, if the gap 95 is determined to be smaller than the permissible size, processing relating to step S24 is performed.

In step S23, the computation instruction device 98 controls the first and second variable D.C. power supplies 30 and 32 so as to reduce the size of the gap 95 between the wafer 34 and the gap sensor 94. Specifically, the computation instruction device 98 issues an instruction for reducing application voltages to the first and second variable D.C. power supplies 30 and 32 in order to relieve the warp in the wafer 34 by means of a temporary drop in attraction force.

After completion of the processing relating to step S23, the processing relating to step S20 is performed again. In this case, the first and second variable D.C. power supplies 30 and 32 reset the application voltages in step S20 according to the instruction from the computation instruction device 98. As a result, the attraction force acting on the wafer 34 drops to thereby diminish the warp in the wafer 34; i.e., the gap 95 in the vicinity of the center of the wafer 34.

In step S24, a determination is made as to whether or not the temperature of the wafer 34 measured by the thermometer 100 has reached a target temperature. If the temperature is determined to have not yet been reached the target temperature, processing relating to step S23 is performed. In contrast, if the temperature is determined to have already reached the target temperature, processing relating to step S25 is performed.

In a case where processing relating to step S23 is performed after processing relating to step S24, the computation instruction device 98 performs control operations in step S23 in order to increase the rate at which the wafer 34 is heated. More specifically, the computation instruction device 98 sends the first and second variable D.C. power supplies 30 and 32 an instruction for increasing attraction force by means of increasing the application voltages. As a result of issue of such an instruction, the attraction force acting on the wafer 34 is increased in step S20, thereby improving heat transfer between the wafer 34 and the dielectric plate 24 and resulting in an increase in the rate at which the wafer 34 is heated.

In step S25, the heating of the wafer 34 is completed. The foregoing processing steps enable completion of the heating of the wafer 34, provided that the gap 95 between the wafer 34 and the dielectric plate 24 is smaller than a permissible size and when the temperature of the wafer 34 has reached the target temperature.

After completion of heating of the wafer 34, processing performed on the wafer 34, such as etching or film-growth processing, is commenced in step S26.

In the seventh embodiment, since attraction of the wafer 34 to the dielectric plate 24 is controlled in the previously-described manner, the wafer 34 can be heated at high speed while the warp is prevented from arising in the wafer 34. Further, for example, even when the target temperature of the wafer 34 is increased, the wafer processing apparatus according to the seventh embodiment enables delicate control, through feedback, of the voltages supplied from the first and second variable D.C. power supplies 30 and 32.

Therefore, the wafer processing apparatus enables quick heating of the wafer 34 without involving development of a fracture regardless of the target temperature of the wafer 34.

In the seventh embodiment, the wafer processing apparatus uses only one gap sensor 94. However, the number of the gap sensors 94 is not limited to one, and a plurality of gap sensors 94 may also be provided for the wafer processing apparatus.

Further, an electrostatic chuck of two-electrode type is used for the wafer processing apparatus according to the seventh embodiment; however, the type of the electrostatic chuck is not limited to a two-electrode type. An arbitrary electrostatic chuck such as mentioned with reference to the previous embodiments may also be used.

In the seventh embodiment, the heater 36 is used as means for heating the wafer 34. However, the heating means is not limited to the heater. A lamp annealing method, a microwave annealing method, or an induction heating method, all of which enable more efficient heating, may also be employed as wafer heating means.

Although in the seventh embodiment a heating medium is not introduced between the dielectric plate 24 and the wafer 34, a heating medium, such as He gas, may be introduced between the dielectric plate 24 and the wafer 34, as in the case of the second and third embodiments.

The major benefits of the present invention described above are summarized as follows:

According to a first aspect of the present invention, since a wafer can be pre-heated before being secured on a dielectric plate, there can be relieved a warp which would be caused by heating. Further, the present invention enables pre-heating of the wafer on the dielectric plate on which the wafer is to be secured. Therefore, the present invention efficiently secures the wafer on the electrostatic chuck without involving development of a fracture in the wafer.

According to a second aspect of the present invention, the pre-heating of the wafer is efficiently implemented through lamp annealing.

According to a third aspect of the present invention, the pre-heating of the wafer is efficiently implemented through microwave annealing.

According to a fourth aspect of the present invention, the pre-heating of the wafer is efficiently implemented through induction heating.

According to a fifth aspect of the present invention, the heat transfer between the dielectric plate and the wafer is increased by introduction of a heating medium therebetween. Thus, the present invention enables heating of the wafer to a desired temperature within a short period of time.

According to a sixth aspect of the present invention, the wafer is efficiently heated by a pre-heated heating medium introduced between the wafer and the dielectric plate. Since the wafer processing apparatus according to the present invention does not require a heater being used as a heating element, the apparatus can be simplified in structure.

According to a seventh aspect of the present invention, gas having superior heat transfer characteristics; e.g., a rare gas such as He gas; or $H_2$ gas, may be used as a heating medium. Therefore, the present invention enables an improvement in heat transfer between the dielectric plate and the wafer.

According to an eighth aspect of the present invention, electrostatic attraction force which increases stepwise can be induced between the wafer and the dielectric plate. As a result of the attraction force acting between the wafer and the dielectric plate, heat transfer therebetween is improved. Further, so long as the attraction force is gradually increased, the warp in the wafer can be sufficiently relieved in an initial stage of the pre-heating phase. Thus, the present invention enables efficient heating of the wafer to a desired temperature within a short period of time without involving development of a fracture in the wafer.

According to a ninth aspect of the present invention, electrostatic attraction force periodically changing the direction thereof is induced between the wafer and the dielectric plate during a pre-heating phase. At the time of reverse of the direction of the electrostatic attraction force, the attraction force is temporarily reduced to zero. Thus, the present invention enables relief of the warp in the wafer every time the electrostatic attraction force becomes zero; i.e., every predetermined cycle. For this reason, the present invention enables prevention of the warp in the wafer during the pre-heating phase.

According to a tenth aspect of the present invention, the amplitude of the voltage applied to the electrodes during the pre-heating phase is constant, and hence superior heat transfer between the wafer and the dielectric plate may be ensured from an initial stage of the pre-heating phase. Thus, the present invention provides conditions suitable for efficiently heating the wafer within a short period of time.

According to an eleventh aspect of the present invention, since the amplitude of the voltage applied to the electrodes during the pre-heating phase is gradually increased, the wafer can freely expand during the initial stage of the same. Thus, the present invention provides conditions suitable for preventing a fracture of the wafer.

According to twelfth to fourteenth aspects of the present invention, the voltage applied to the electrodes can be changed into a rectangular waveform, a sinusoidal waveform, or a triangular waveform, respectively, and this application voltage can be readily produced by a known method. Thus, the present invention enables reversal of polarities of application voltages through use of a simple configuration.

According to a fifteenth aspect of the present invention, attraction force sequentially acts on the wafer from its center to its periphery since voltages are sequentially applied to at least three electrodes arranged in the radial direction. Thus, the present invention enables relief of warp in the wafer, which would be caused in an initial stage of the pre-heating phase, as well as spreading, over the entire wafer, of the warp still remaining in the wafer. Thus, the present invention effectively prevents development of a fracture in the wafer, which would otherwise be caused by heating.

According to a sixteenth aspect of the present invention, through appropriate control of the voltages applied to at least three electrodes arranged in the radial direction, the attraction force acting on the wafer can be gradually reduced from the center to the periphery of the wafer. Thus, the present invention enables correct relief of the warp arising in the wafer at the initial stage of the pre-heating phase toward the periphery of the wafer, thereby effectively preventing development of a fracture in the wafer, which would otherwise be caused by heating.

According to a seventeenth aspect of the present invention, the position of the wafer where the attraction force acts on rotates along the peripheral direction of the wafer since voltages are sequentially applied to a plurality of electrodes which are separated from one another along radially-extending boundaries. Thus, the present invention enables correct relief of warp, which would be caused by pre-heating, as well as spreading, over the entire wafer, of the warp still remaining in the wafer, thereby effectively preventing development of a fracture in the wafer, which would otherwise be caused by heating.

According to an eighteenth aspect of the present invention, the voltages applied to the electrodes can be controlled; i.e., the attraction force acting on the wafer can be controlled, through feedback. Consequently, the present invention always enables efficient completion of heating of the wafer within a short period of time without involving development of a fracture in the wafer, regardless of various requirements for securing the wafer on the electrostatic chuck.

Further, the present invention is not limited to these embodiments, but variations and modifications may be made without departing from the scope of the present invention.

The entire disclosure of Japanese Patent Application No. Hei 11-62638 filed on Mar. 10, 1999 including specification, claims, drawings and summary are incorporated herein by reference in its entirety.

What is claimed is:

1. A wafer processing apparatus comprising:
   a mechanism for heating a wafer within a processing chamber;
   a dielectric plate on which the wafer is placed;
   electrode for attracting the wafer to the dielectric plate wherein said electrodes comprise at least two electrodes;
   a variable D.C. power supply coupled to the electrodes for supplying voltages to the electrodes;
   pre-heating means for pre-heating the wafer placed on the dielectric plate; and control means configured for controlling the variable D.C. power supply to supply the voltages to the electrodes such that the wafer is attracted to the dielectric plate after the wafer is pre-heated.

2. The wafer processing apparatus according to claim 1, wherein the pre-heating means heats the wafer through lamp annealing by means of an infrared lamp.

3. The wafer processing apparatus according to claim 1, wherein the pre-heating means heats the wafer through microwave annealing through use of microwaves.

4. The wafer processing apparatus according to claim 1, wherein the pre-heating means comprises electric field generation means for generating electric fields whose polarities are reversed every predetermined cycle and heats the wafer through induction heating which is associated with generation of the electric field.

5. The wafer processing apparatus according to claim 1, further comprising voltage application means which makes the variable D.C. power supplies supply voltages to the electrodes during the pre-heating phase and gradually increases the voltages to a predetermined voltage.

6. The wafer processing apparatus according to claim 1, further comprising voltage application means which makes the variable D.C. power supplies supply voltages to the electrodes during the pre-heating phase and changes the polarities of the voltages every predetermined cycle.

7. The wafer processing apparatus according to claim 6, wherein the voltages applied to the electrodes from the variable D.C. power supplies assume a constant amplitude.

8. The wafer processing apparatus according to claim 6, wherein the voltages applied to the electrodes from the variable D.C. power supplies are gradually increased in amplitude.

9. The wafer processing apparatus according to claim 8, wherein the voltages applied to the electrodes from the variable D.C. power supplies assume a rectangular waveform.

10. The wafer processing apparatus according to claim 8, wherein the voltages applied to the electrodes from the variable D.C. power supplies assume a sinusoidal waveform.

11. The wafer processing apparatus according to claim 8, wherein the voltages applied to the electrodes from the variable D.C. power supplies assume a triangular waveform.

12. The wafer processing apparatus according to claim 1, further comprising:
voltage application means for making the variable D.C. power supplies supply voltages to the electrodes during the pre-heating phase;
wherein:
said electrodes comprise at least three electrodes which are separated from one another and are arranged in the radial direction of the dielectric plate, and
the voltage application means controls the variable D.C. power supplies such that the voltage is applied to the at least three electrodes in sequence from an electrode positioned in the vicinity of the center of the dielectric plate to an electrode positioned in the vicinity of periphery of the dielectric plate.

13. The wafer processing apparatus according to claim 1, further comprising:
voltage application means for making the variable D.C. power supplies supply voltages to the electrodes during the pre-heating phase;
wherein:
said electrodes comprise at least three electrodes which are separated from one another and are arranged in the radial direction of the dielectric plate, and
the voltage application means controls the variable D.C. power supplies such that the voltage applied to the at least three electrodes becomes increasingly smaller in sequence from voltage applied to an electrode positioned in the vicinity of the center of the dielectric plate to voltage applied to an electrode positioned in the vicinity of periphery of the dielectric plate.

14. The wafer processing apparatus according to claim 1, further comprising:
voltage application means for making the variable D.C. power supplies, supply voltages to the electrodes during the pre-heating phase;
wherein:
the at least two electrodes are separated from one another along boundaries extending radial direction of the dielectric plate, and
the voltage application means controls the variable D.C. power supplies such that the voltage is sequentially supplied to the at least two electrodes in a clockwise or counterclockwise direction.

15. The wafer processing apparatus according to claim 1, further comprising:
a gap sensor for measuring a gap between the dielectric plate and the wafer placed thereon; and
feedback means for controlling the voltages supplied to the electrodes from the variable D.C. power supplies such that the gap measured by the gap sensor becomes smaller.

16. The wafer processing apparatus according to claim 1, wherein the pre-heating means comprises:
at least one heating medium inlet port communicating with the space between the dielectric plate and the wafer placed thereon; and
heating medium supplying means for supplying a heating medium having superior heat transfer characteristics to the heating medium inlet port.

17. The wafer processing apparatus according to claim 16, wherein the pre-heating means has a heating device for heating the heating medium beforehand to a desired temperature.

18. The wafer processing apparatus according to claim 16, wherein the hating medium comprises gas selected form the rare gas group comprising He gas, Ne gas, and Ar gas, or gas selected from the group comprising $N_2$ gas and $O_2$ gas.

* * * * *